US012765391B2

(12) United States Patent
Kang et al.

(10) Patent No.: US 12,765,391 B2
(45) Date of Patent: Oct. 13, 2026

(54) SEMICONDUCTOR PACKAGE INCLUDING A LASER MARK AREA COMPRISING PORTIONS OF A REDISTRIBUTION LEVEL LAYER

(71) Applicant: Samsung Electronics Co., Ltd., Suwon-si (KR)

(72) Inventors: Junghoon Kang, Suwon-si (KR); Seungwan Shin, Suwon-si (KR); Byungmin Yu, Suwon-si (KR); Junghyun Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 586 days.

(21) Appl. No.: 18/131,258

(22) Filed: Apr. 5, 2023

(65) Prior Publication Data

US 2023/0326871 A1 Oct. 12, 2023

(30) Foreign Application Priority Data

Apr. 7, 2022 (KR) ........................ 10-2022-0043644

(51) Int. Cl.

*H10W 46/00* (2026.01)
*B23K 26/364* (2014.01)

(Continued)

(52) U.S. Cl.

CPC ........... *H10W 46/00* (2026.01); *B23K 26/364* (2015.10); *H10B 80/00* (2023.02); *H10W 70/65* (2026.01); *H10W 74/121* (2026.01); *H10W 90/00* (2026.01); *H10W 90/401* (2026.01); *H10W 90/701* (2026.01); *B23K 2101/40* (2018.08);

(Continued)

(58) Field of Classification Search

None

See application file for complete search history.

(56) References Cited

U.S. PATENT DOCUMENTS

| | | | |
|---|---|---|---|
| 9,343,434 | B2 | 5/2016 | Chen |
| 9,508,696 | B2 | 11/2016 | Chen |

(Continued)

FOREIGN PATENT DOCUMENTS

| | | | |
|---|---|---|---|
| KR | 10-2015-0137964 | A | 12/2015 |
| KR | 10-2021-0030774 | A | 3/2021 |
| KR | 1020220027333 | A | 3/2022 |

*Primary Examiner* — William Henry Anderson

(74) *Attorney, Agent, or Firm* — Muir Patent Law, PLLC

(57) ABSTRACT

A semiconductor package includes an encapsulation layer encapsulating at least one semiconductor chip, and a redistribution level layer disposed on the encapsulation layer. The redistribution level layer includes a redistribution layer and a redistribution insulating layer insulating the redistribution layer, a laser mark area is disposed on the redistribution layer and the redistribution insulating layer, and the redistribution insulating layer of the laser mark area comprises a plurality of mesh-type redistribution insulating patterns arranged apart from each other on a plane and surrounded by the redistribution layer. The redistribution level layer includes a laser mark insulating layer located on the redistribution layer and the redistribution insulating layer, wherein the laser mark insulating layer includes a laser mark exposing the redistribution layer and the mesh-type redistribution insulating patterns in the laser mark area.

20 Claims, 19 Drawing Sheets

(51) Int. Cl.

| | |
|---|---|
| ***H10B 80/00*** | (2023.01) |
| ***H10W 70/65*** | (2026.01) |
| ***H10W 74/10*** | (2026.01) |
| ***H10W 90/00*** | (2026.01) |
| *B23K 101/40* | (2006.01) |
| *H10W 70/60* | (2026.01) |

(52) U.S. Cl.

CPC ........ *H10W 46/101* (2026.01); *H10W 46/103* (2026.01); *H10W 46/106* (2026.01); *H10W 46/407* (2026.01); *H10W 46/601* (2026.01); *H10W 46/607* (2026.01); *H10W 70/60* (2026.01); *H10W 70/611* (2026.01); *H10W 90/722* (2026.01); *H10W 90/724* (2026.01); *H10W 90/754* (2026.01)

(56) References Cited

U.S. PATENT DOCUMENTS

| | | | | |
|---|---|---|---|---|
| 9,589,900 | B2 | 3/2017 | Su et al. | |
| 9,721,933 | B2 | 8/2017 | Chen | |
| 9,728,508 | B2 | 8/2017 | Lin et al. | |
| 10,818,607 | B2 | 10/2020 | Lin et al. | |
| 10,825,778 | B2 | 11/2020 | Bae et al. | |
| 11,189,567 | B2 | 11/2021 | Han et al. | |
| 2017/0084543 | A1* | 3/2017 | Lin | H10W 46/00 |
| 2020/0105679 | A1* | 4/2020 | Bae | H01L 24/20 |
| 2020/0111742 | A1* | 4/2020 | Han | H01L 23/3128 |
| 2020/0328102 | A1* | 10/2020 | Schepis | H10P 72/0614 |
| 2022/0068818 | A1 | 3/2022 | Song et al. | |
| 2022/0223564 | A1* | 7/2022 | Chen | H10W 90/00 |
| 2023/0048228 | A1* | 2/2023 | Lee | H10W 46/00 |
| 2024/0332205 | A1* | 10/2024 | Masuzawa | B23K 26/073 |

* cited by examiner

SEMICONDUCTOR PACKAGE INCLUDING A LASER MARK AREA COMPRISING PORTIONS OF A REDISTRIBUTION LEVEL LAYER

CROSS-REFERENCE TO RELATED APPLICATION

This application is based on and claims priority under 35 U.S.C. § 119 to Korean Patent Application No. 10-2022-0043644, filed on Apr. 7, 2022, in the Korean Intellectual Property Office, the disclosure of which is incorporated by reference herein in its entirety.

BACKGROUND

The inventive concept relates to a semiconductor package, and more particularly, to a semiconductor package including a laser mark.

A laser mark displaying product information may be provided on a surface of a semiconductor package including a semiconductor chip. The laser mark needs to increase the degree of freedom in package design without increasing a package thickness. In addition, the laser mark needs to have good visibility that may be easily recognized by consumers.

SUMMARY

The inventive concept provides a semiconductor package including a laser mark having good visibility and improving the degree of freedom in package design while not increasing a package thickness.

According to an aspect of the inventive concept, there is provided a semiconductor package including an encapsulation layer encapsulating at least one semiconductor chip, and a redistribution level layer disposed on the encapsulation layer.

The redistribution level layer includes a redistribution layer and a redistribution insulating layer insulating the redistribution layer, a laser mark area is disposed on the redistribution layer and the redistribution insulating layer, and the redistribution insulating layer of the laser mark area includes a plurality of mesh-type redistribution insulating patterns arranged apart from each other on a plane and surrounded by the redistribution layer.

The redistribution level layer includes a laser mark insulating layer located on the redistribution layer and the redistribution insulating layer, wherein the laser mark insulating layer includes a laser mark exposing the redistribution layer and the mesh-type redistribution insulating patterns in the laser mark area.

According to another aspect of the inventive concept, there is provided a semiconductor package including an encapsulation layer encapsulating at least one semiconductor chip, and a redistribution level layer disposed on the encapsulation layer.

The redistribution level layer includes a redistribution layer and a redistribution insulating layer insulating the redistribution layer, a laser mark area is disposed on the redistribution layer and the redistribution insulating layer, the redistribution layer includes a laser mark metal layer, and the redistribution insulating layer of the laser mark area includes a plurality of mesh-type redistribution insulating patterns arranged apart from each other on a plane and surrounded by the laser mark metal layer.

The redistribution level layer includes a laser mark insulating layer located on the laser mark metal layer and the mesh-type redistribution insulating patterns, wherein the laser mark insulating layer includes a laser mark exposing the laser mark metal layer and the mesh-type redistribution insulating patterns in the laser mark area, and the laser mark metal layer exposed by the laser mark includes a first laser mark metal pattern having a first length in a horizontal direction and a second laser mark metal pattern having a second length in the horizontal direction greater than the first length.

According to another aspect of the inventive concept, there is provided a semiconductor package including a fan-in area in which a semiconductor chip is located, and a fan-out area including a package element surrounding the fan-in area and having an inner wiring layer, a package body level layer including a fan-in encapsulation layer sealing the semiconductor chip in the fan-in area, a first redistribution level layer disposed on a lower surface of the package body level layer and including a first redistribution layer extending to the fan-out area and a first redistribution insulating layer insulating the first redistribution layer, and a second redistribution level layer disposed on the upper surface of the package body level layer, and including a second redistribution layer extending to the fan-out area, and a second redistribution insulating layer insulating the second redistribution layer.

The second redistribution level layer further includes a laser mark area located on the second redistribution layer and the second redistribution insulating layer, the second redistribution insulating layer located inside the laser mark area includes a plurality of mesh-type redistribution insulating patterns disposed to be spaced apart from each other on a plane.

The second redistribution level layer further includes a laser mark insulating layer located on the second redistribution layer and the second redistribution insulating layer, and a laser mark exposing the second redistribution layer and the mesh-type redistribution insulating patterns located in the laser mark area.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Hereinafter, embodiments of the inventive concept will be described in detail with reference to the accompanying drawings. The following embodiments of the inventive concept may be implemented by only one embodiment, and also, the following embodiments may be implemented by combining one or more embodiments. Accordingly, the inventive concept is not construed as being limited to one embodiment.

In the present specification, the singular form of the elements may include the plural form unless the context clearly indicates otherwise. In the present specification, the drawings are exaggerated in order to more clearly explain the inventive concept.

Figure 1:
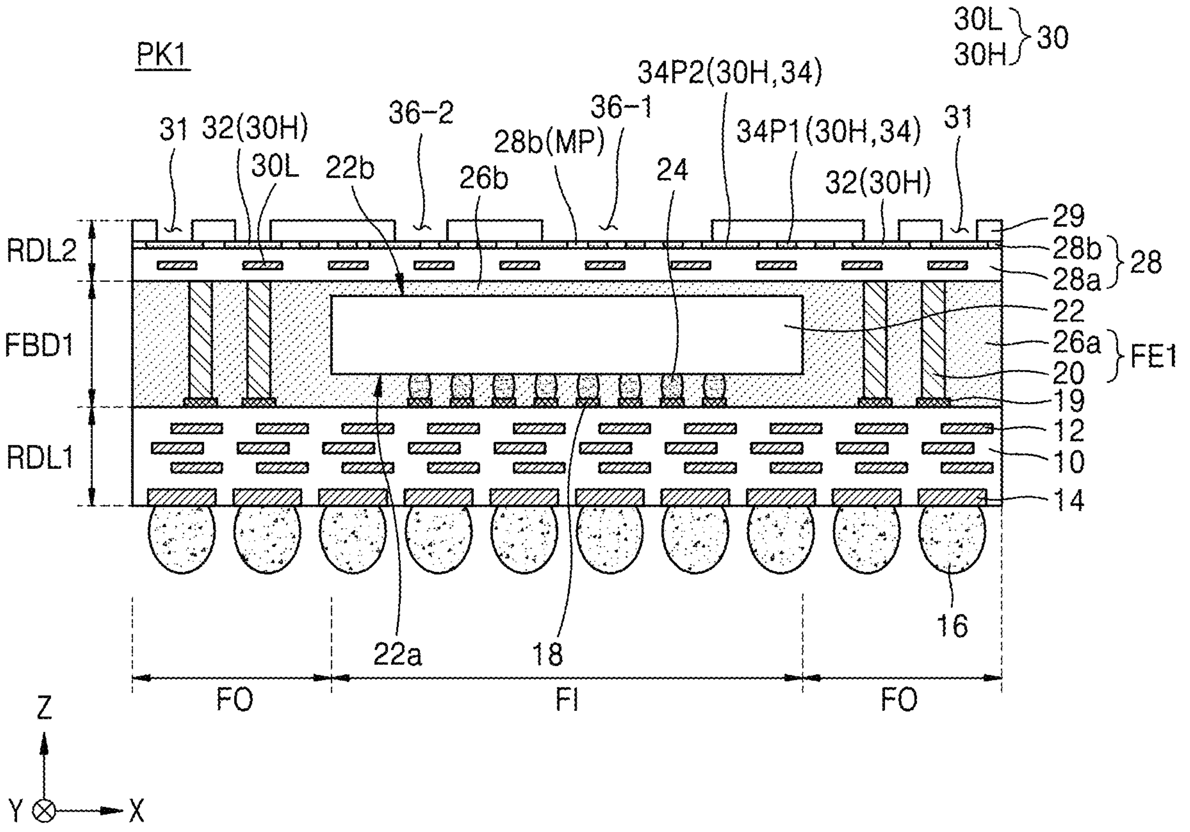
FIG. 1 is a cross-sectional view of a semiconductor package according to an embodiment of the inventive concept.

FIG. 1 is a cross-sectional view of a semiconductor package PK1 according to an embodiment of the inventive concept.

For example, FIG. 1 may be a cross-sectional view of the semiconductor package PK1, e.g., on a cutting plane parallel to an X direction and a Z direction. The semiconductor package PK1 may be a fan-out semiconductor package. The semiconductor package PK1 may be a Fan Out Wafer Level Package (FOWLP)-type package.

The semiconductor package PK1 may include a fan-in area FI where a semiconductor chip 22 is located, and a fan-out area FO on both sides of the fan-in area FI. The fan-out area FO may surround the fan-in area FI in a planar manner, e.g., in a plan view. In FIG. 1, one semiconductor chip 22 is illustrated in the fan-in area FI for convenience. In some embodiments, differently from FIG. 1, a plurality of semiconductor chips may be stacked in a vertical direction (Z direction) in the fan-in area FI. In some embodiments, differently from FIG. 1, a plurality of chips may be disposed apart from each other in a horizontal direction (X direction) in the fan-in area FI.

The semiconductor chip 22 may be a logic chip, a power management integrated circuit (PMIC) chip, or a memory chip. In some embodiments, the logic chip may be a memory controller chip, a central processing unit (CPU) chip, a graphics processing unit (GPU) chip, or an application processor (AP) chip.

In some embodiments, the memory chip may be a dynamic random access memory (DRAM) chip, a static random access memory (SRAM) chip, a flash memory chip, an electrically erasable and programmable read-only memory (EEPROM) chip, a phase-change random access memory (PRAM) chip, a magnetic random access memory (MRAM) chip, or a resistive random access memory (RRAM) chip.

The semiconductor chip 22 may include a front surface 22*a* and a rear surface 22*b*. The front surface 22*a* may be an active surface, and the rear surface 22*b* may be an inactive surface. A chip solder ball 24 is disposed on the front surface 22*a*. The chip solder ball 24 may be a chip connection ball or a chip connection bump.

The fan-out area FO may include a package element FE1 having an inner wiring layer 20. The inner wiring layer 20 may be a metal post layer, for example, a copper post layer. The inner wiring layer 20 may be a metal via layer. The package element FE1 may further include a fan-out encapsulation layer 26*a* sealing the inner wiring layer 20. For example, the fan-out encapsulation layer 26*a* may contact side surfaces of the inner wiring layer 20, and the inner wiring layer 20 may penetrate the fan-out encapsulating layer 26*a* from its bottom to its top. The fan-out encapsulation layer 26*a* may be made of epoxy molding compound (EMC).

The semiconductor chip 22 in the fan-in area FI may be sealed by a fan-in encapsulation layer 26*b*. For example, the fan-in encapsulation layer 26*b* may contact side walls, a bottom surface and a top surface of the semiconductor chip 22. The fan-in encapsulation layer 26*b* may be the same body as the fan-out encapsulation layer 26*a* constituting the package element FE1. The fan-in encapsulation layer 26*b* may be made of the same material as the fan-out encapsulation layer 26*a* constituting the package element FE1.

The semiconductor chip 22 in the fan-in area FI, the fan-in encapsulation layer 26*b* sealing the semiconductor chip 22 in the fan-in area FI, and the package element FE1 having the inner wiring layer 20 in the fan-out area FO and the fan-out encapsulation layer 26*a* may constitute a package body level layer FBD1.

The semiconductor package PK1 may include a first redistribution level layer RDL1 and a second redistribution level layer RDL2. The first redistribution level layer RDL1 is formed on the front surface 22*a* of the semiconductor chip 22, and thus may be referred to as a front redistribution level layer. The second redistribution level layer RDL2 is formed on the rear surface 22*b* (or a back surface) of the semiconductor chip 22, and thus may be referred to as a rear redistribution level layer.

The first redistribution level layer RDL1 may be disposed on a lower surface of the package body level layer FBD1 and may include a first redistribution layer 12 extending to the fan-out area FO and a first redistribution insulating layer 10 insulating the first redistribution layer 12. The first redistribution layer 12 may include a metal layer, for example, formed of copper (Cu), aluminum (Al), nickel (Ni), titanium (Ti), chromium (Cr), gold (Au), silver (Ag), palladium (Pd), platinum (Pt), or an alloy thereof. The first redistribution layer 12 may include a single layer or multiple layers of the metal material mentioned above.

The first redistribution insulating layer 10 may include or may be a dielectric layer. The first redistribution insulating layer 10 may be formed of an organic polymer, e.g., polybenzoxazole (PBO), benzocyclobutene (BCB), polyimide, etc. The first redistribution insulating layer 10 may be formed of an inorganic material, such as silicon oxide, silicon nitride, or silicon oxynitride.

The first redistribution level layer RDL1 may include a first redistribution pad 14 electrically connected to the first redistribution layer 12 and disposed on the lower surface of the first redistribution level layer RDL1. The first redistribution pad 14 may be a metal layer/pattern, for example, a copper layer, a nickel layer, or a gold layer.

In FIG. 1, the first redistribution pad 14 is illustrated to be included in the first redistribution level layer RDL1 for convenience, but the first redistribution pad 14 may be formed on the first redistribution level layer RDL. A first solder ball 16 may be disposed on the first redistribution pad 14. The first solder ball 16 may be an external connection terminal for connecting to an external device.

As used herein, components described as being "electrically connected/coupled" are configured such that an electrical signal can be transferred from one component to the other (although such electrical signal may be attenuated in strength as it transferred and may be selectively transferred).

The first redistribution level layer RDL1 may include a chip connection pad 18 and a post connection pad 19 electrically connected to the first redistribution layer 12 and disposed on the upper surface of the first redistribution level layer RDL1. The chip connection pad 18 and the post connection pad 19 may be a metal layer/pattern, such as a copper or aluminum layer.

In some embodiments, the chip connection pad 18 and the post connection pad 19 may be formed on the first redistribution insulating layer 10 of the first redistribution level layer RDL1 and included in the package body level layer FBD1. In some embodiments, the chip connection pad 18 and the post connection pad 19 may be formed inside the first redistribution insulating layer 10 and included in the first redistribution level layer RDL1.

The chip connection pad 18 may be electrically connected to the chip solder ball 24 of the semiconductor chip 22. In some embodiments, the chip connection pad 18 may be directly connected to a chip pad (not shown) without through the chip solder ball 24. The post connection pad 19 may be electrically connected to the inner wiring layer 20, e.g., a metal post layer.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact.

The second redistribution level layer RDL2 may be disposed on the upper surface of the package body level layer FBD1 and include a second redistribution layer 30 extending to the fan-out area FO, and a second redistribution insulating layer 28 insulating the second redistribution layer 30. The second redistribution layer 30 may be formed of the same material as the first redistribution layer 12. In some embodiments, the second redistribution insulating layer 28 may be formed of the same material as the first redistribution insulating layer 10.

The second redistribution layer 30 may include a second lower redistribution layer 30L and a second upper redistribution layer 30H. The second redistribution insulating layer 28 may include a second lower redistribution insulating layer 28*a* and a second upper redistribution insulating layer 28*b*. A laser mark area (34*r* of FIG. 2) may be disposed/formed on the second upper redistribution layer 30H and the second upper redistribution insulating layer 28*b* as described in detail below.

When the laser mark area (34*r* in FIG. 2) is directly formed on the second upper redistribution layer 30H and the second upper redistribution insulating layer 28*b*, a dummy metal layer (or a dummy pad) for the laser mark area is not separately formed, and thus, the degree of freedom in package design may be improved. The second upper redistribution layer 30H may be a laser mark metal layer 34. The second upper redistribution layer 30H may be a real wiring layer electrically connected to the semiconductor chip 22. For example, the laser mark metal layer 34 may be a wiring layer electrically connected to the semiconductor chip 22 or a dummy metal pattern formed in the same layer as the wiring layer in certain embodiments. For example, the laser mark metal layer 34 may not be electrically connected to the semiconductor chip 22 in certain embodiments.

The second upper redistribution insulating layer 28*b* of the laser mark area (34*r* in FIG. 2) includes a plurality of mesh-type redistribution insulating patterns MP arranged apart from each other on a plane inside the second upper redistribution layer 30H, as described in detail below. According to the formation of the mesh-type redistribution insulating patterns MP, the second upper redistribution layer 30H may include a first laser mark metal pattern 34P1 and a second laser mark metal pattern 34P2. A second length (or a second width) of the second laser mark metal pattern 34P2 may be greater than a first length (or a first width) of the first laser mark metal pattern 34P1 in the X direction, e.g., in a cross-sectional view.

The second redistribution level layer RDL2 includes a laser mark insulating layer 29 having laser marks 36-1 and 36-2 on the second upper redistribution layer 30H and the second upper redistribution insulating layer 28*b*. The laser mark insulating layer 29 may include the laser marks 36-1 and 36-2 exposing the second upper redistribution layer 30H and the mesh-type redistribution insulating patterns MP in the laser mark area (34*r* of FIG. 2). For example, the laser mark area 34*r* may include or be formed of a portion of the second upper redistribution layer 30H (e.g., the first and second laser mark metal patterns 34P1 and 34P2), a portion of the second upper redistribution insulating layer 28*b* (e.g., the plurality of mesh-type redistribution insulating patterns MP), and a portion of the laser mark insulating layer 29 including the laser marks 36-1 and 36-2.

The laser marks 36-1 and 36-2 may include letters, numbers, and recognition codes indicating various pieces of information of the semiconductor package PK1. The laser marks 36-1 and 36-2 will be described in detail below.

In some embodiments, the laser mark insulating layer 29 may be formed of the same material as the second redistribution insulating layer 28. In some embodiments, the laser mark insulating layer 29 may be a film in which an inorganic filler (e.g., silicon oxide) is dispersed in an epoxy resin.

The semiconductor package PK1 may include a second redistribution pad 32. The second upper redistribution layer 30H may include the second redistribution pad 32. The second redistribution pad 32 and the laser mark metal layer 34 may be simultaneously formed at the same level, e.g., with the same material. The second redistribution pad 32 may be a metal pad. The second redistribution pad 32 may be a joint pad electrically coupled to an external semiconductor package. In some embodiments, the second redistribution pad 32 may be disposed in the fan-out area FO.

The second redistribution pad 32 may be electrically connected to the second redistribution layer 30. In some embodiments, the second redistribution pad 32 may be formed of the same material as the second redistribution layer 30. The second redistribution pad 32 may be disposed on the second redistribution level layer RDL2 to be separated from the laser mark metal layer 34. The second redistribution pad 32 may be exposed to the outside by a contact hole 31 formed in the laser mark insulating layer 29.

A solder ball (not shown) may be formed on the second redistribution pad 32. The external semiconductor package may be mounted on the solder ball.

As described above, in the semiconductor package PK1 of the inventive concept, the laser marks 36-1 and 36-2 may be formed on the second redistribution level layer RDL2, and thus, the degree of freedom in package design may be improved without increasing the package thickness.

In addition, in the semiconductor package PK1, the laser mark insulating layer 29 may be disposed on the second upper redistribution layer 30H and the mesh-type redistribution insulating patterns MP, and the laser marks 36-1 and 36-2 may be formed to expose the second upper redistribution layer 30H and the mesh-type redistribution insulating patterns MP. Accordingly, the semiconductor package PK1 may diffusely reflect light from the second upper redistribution layer 30H inside the laser marks 36-1 and 36-2, thereby improving visibility of the laser marks 36-1 and 36-2.

Figure 2:
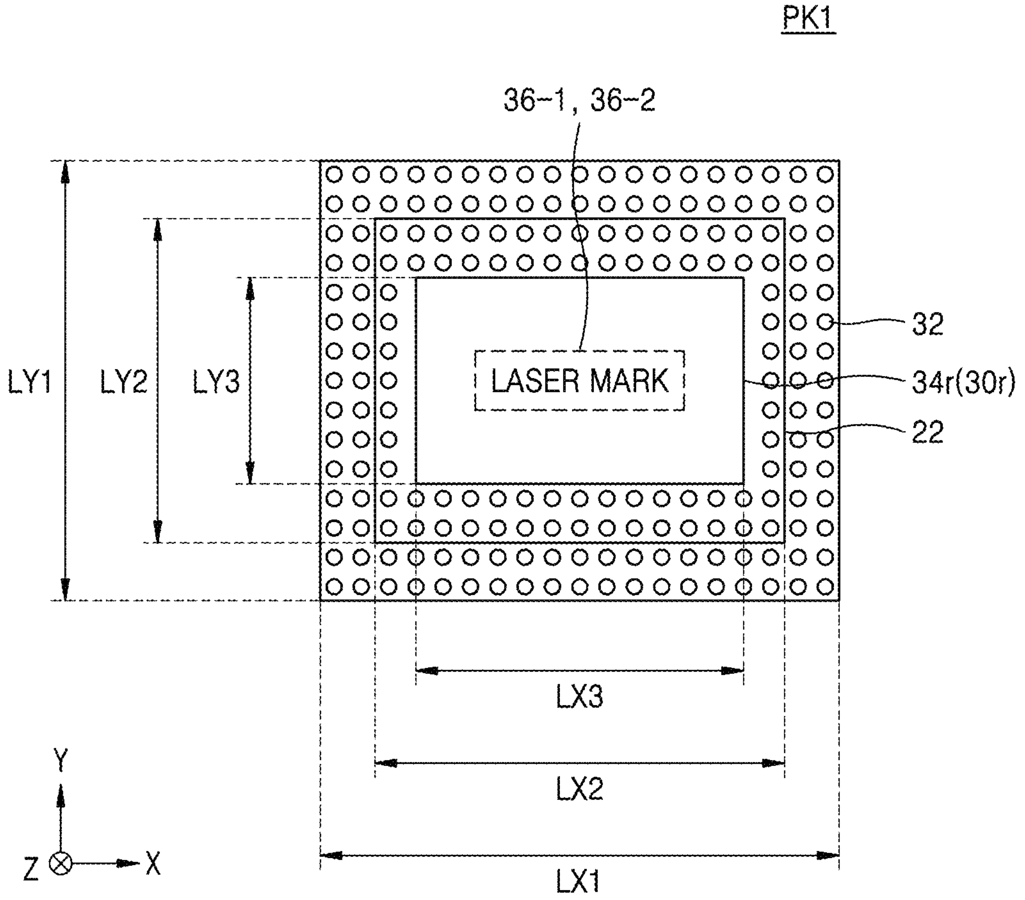
FIG. 2 is a top plan view of the semiconductor package of FIG. 1.

FIG. 2 is a top plan view of the semiconductor package PK1 of FIG. 1.

In FIG. 2, the same reference numerals as or similar reference numerals to those of FIG. 1 denote the same or similar members. The semiconductor package PK1 of FIG. 2 may be a plan view in an XY plane/direction, e.g., in a plane extending an X direction and a Y direction.

The semiconductor package PK1 may have lengths LX1 and LY1 in the X and Y directions, respectively. In some embodiments, LX1 and LY1 may be tens of millimeters (mm), such as 10 mm to 60 mm. In FIG. 2, LX1 is illustrated to be greater than LY1, but LX1 and LY1 may be the same or LX1 may be less than LY1.

The semiconductor package PK1 may include the semiconductor chip 22. The semiconductor chip 22 may have lengths LX2 and LY2 in the X and Y directions, respectively. In some embodiments, LX2 and LY2 may be several millimeters (mm) to several tens of millimeters (mm), such as 6 mm to 54 mm.

The semiconductor package PK1 may include the laser mark area 34*r*. The laser mark area 34*r* may include the laser mark metal layer (34 of FIG. 1) and an upper portion of the mesh-type redistribution insulating patterns (MP of FIG. 1).

The laser mark area 34*r* may be disposed in a partial area of the entire surface area of the second redistribution level layer (RDL2 of FIG. 1) of the fan-in area (FI of FIG. 1). The laser mark area 34*r* may be located in a central region of the semiconductor package PK1. For example, the laser mark area 34*r* may be located in a central region of a top surface of the semiconductor package PK1. The laser mark area 34*r* may be located in a central region of the semiconductor chip 22, e.g., in a plan view.

The laser mark area 34*r* may be located in a central region of the second redistribution level layer (RDL2 of FIG. 1). The second redistribution pad 32 may be located in a peripheral region of the second redistribution level layer (RDL2 of FIG. 1). The laser mark area 34*r* may have lengths LX3 and LY3 in the X and Y directions, respectively. In some embodiments, LX3 and LY3 may be several millimeters to several tens of millimeters, such as 4 mm to 50 mm. In the semiconductor package PK1, the laser marks 36-1 and 36-2 may be disposed in the laser mark area 34*r*. The laser marks 36-1 and 36-2 will be described in detail below.

Figure 3:
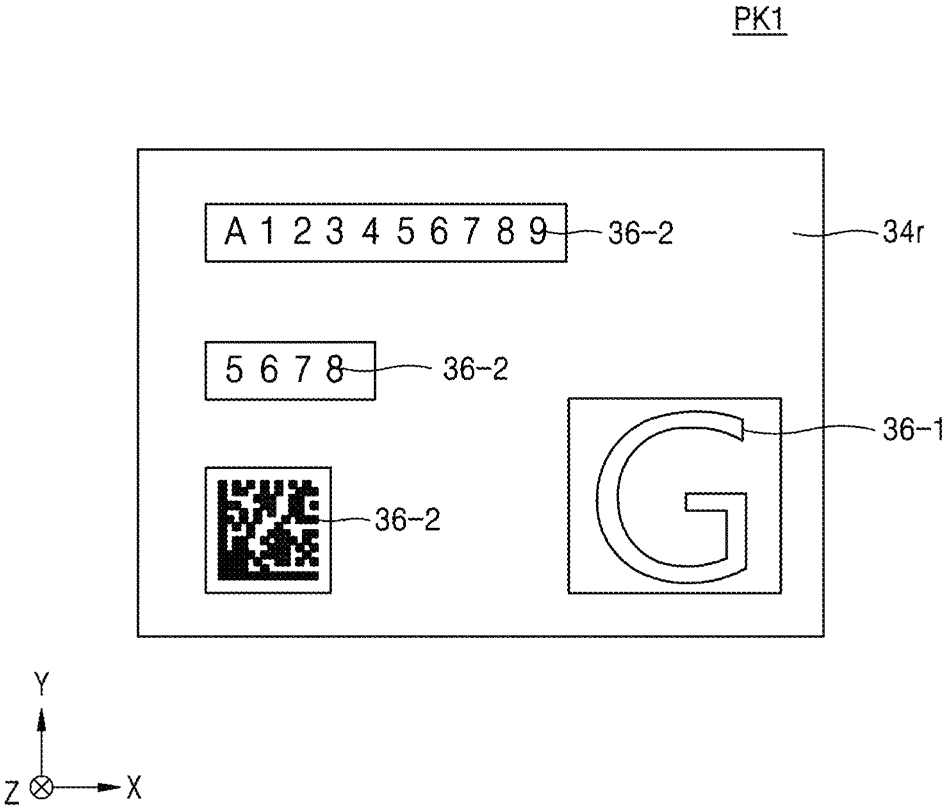
FIG. 3 is a plan view illustrating laser marks formed in a laser mark area of the semiconductor package of FIGS. 1 and 2.

FIG. 3 is a plan view illustrating the laser marks 36-1 and 36-2 formed in the laser mark area 34*r* of the semiconductor package PK1 of FIGS. 1 and 2.

For example, in FIG. 3, the same reference numerals as or similar reference numerals to those of FIGS. 1 and 2 denote the same or similar members. In the semiconductor package PK1, the laser mark area 34*r* may be disposed inside the second redistribution level layer (RDL2 of FIG. 1). A plurality of laser marks 36-1 and 36-2 may be included/formed in the laser mark area 34*r*.

The laser marks 36-1 and 36-2 may include letters, numbers, recognition codes, and combinations thereof indicating various pieces of information of the semiconductor package PK1. For example, the laser mark 36-1 may be a logo of a manufacturing company or a sales company, such as the letter G. The laser mark 36-1 may be a logo of a product, for example, the letter G. The laser mark 36-2 may include a serial number. The laser mark 36-2 may be a product identification code, for example, a 2D bar code and a QR code.

Figure 4:
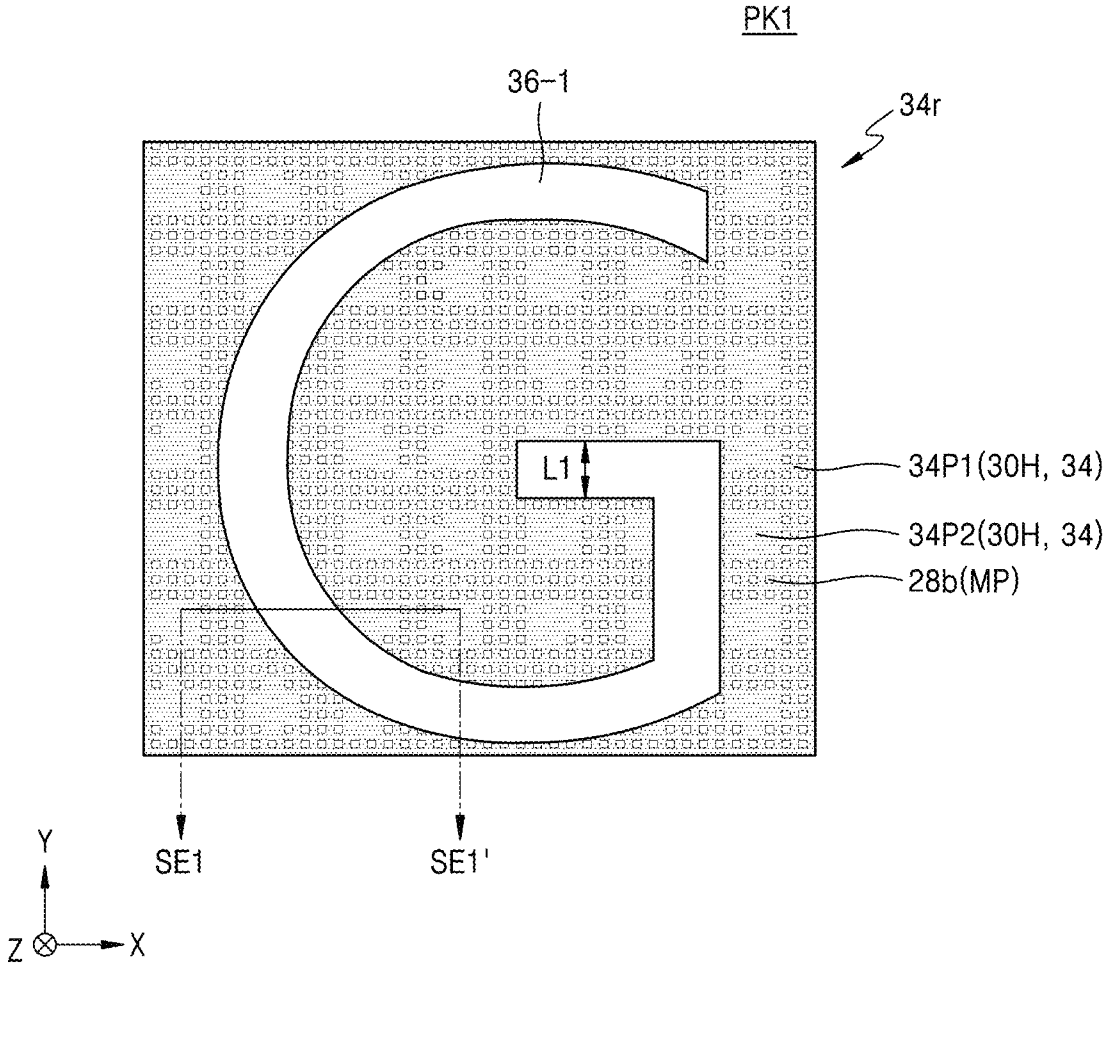
FIG. 4 is an enlarged plan view illustrating a laser mark formed in the laser mark area of the semiconductor package of FIGS. 1 to 3.

FIG. 4 is an enlarged plan view illustrating the laser mark 36-1 formed in the laser mark area 34*r* of the semiconductor package of FIGS. 1 to 3.

For example, in FIG. 4, the same reference numerals as or similar reference numerals to those of FIGS. 1 to 3 denote the same or similar members. In descriptions with respect to FIG. 4, the descriptions given with reference to FIGS. 1 to 3 will be briefly provided or omitted. FIG. 4 is an enlarged view of the laser mark 36-1 of FIG. 3.

The laser mark 36-1 included in the semiconductor package PK1, for example, the letter G, may be disposed inside the laser mark area 34*r*. The laser mark 36-1 may have a length (L1, or width) of several hundred micrometers (μm), for example, 500 to 700 micrometers (μm). The laser mark area 34*r* may be disposed on the second upper redistribution layer 30H and the second upper redistribution insulating layer 28*b*. The second upper redistribution layer 30H may be the laser mark metal layer 34.

The second upper redistribution insulating layer 28*b* of the laser mark area 34*r* may include a plurality of mesh-type redistribution insulating patterns MP disposed apart from each other on a plane (e.g., X-Y plane) inside the second upper redistribution layer 30H. For example, the mesh-type redistribution insulating patterns MP may be respectively disposed between adjacent parts of the second upper redistribution layer 30H. The mesh-type redistribution insulating patterns MP may be all non-uniformly disposed inside the second upper redistribution layer 30H of the laser mark area 34*r*. For example, each of the mesh-type redistribution insulating patterns MP may be surrounded by the second upper redistribution layer 30H. For example, side walls of each of the mesh-type redistribution insulating patterns MP may contact the second upper redistribution layer 30H. For example, the mesh-type redistribution insulating patterns MP may be a plurality of isolated insulator patterns spaced apart from each other on a horizontal plane (e.g., on a top surface of the second lower redistribution insulating layer 28*a*). For example, the mesh-type redistribution insulating patterns MP may be spaced apart from each other in the X direction and in a Y direction. The second upper redistribution layer 30H may surround the mesh-type redistribution insulating patterns MP and the laser mark area 34*r*.

According to the formation of the mesh-type redistribution insulating patterns MP, the second upper redistribution layer 30H may include a first laser mark metal pattern 34P1 and a second laser mark metal pattern 34P2. As shown in FIG. 1, a second length (or a second width) of the second laser mark metal pattern 34P2 on a cross-section in the X direction may be greater than a first length (or a first width) of the first laser mark metal pattern 34P1. For example, the first length/width and the second length/width may be distances in the X direction.

The laser mark 36-1 may be disposed on the second upper redistribution layer 30H and the mesh-type redistribution insulating patterns MP. The laser mark 36-1 may adjust/control a reflectance difference (e.g., a shade difference) between the second upper redistribution layer 30H and the mesh-type redistribution insulating patterns MP, thereby visibly implementing a white color. The white color may be in a range (⅓±0.03, ⅓±0.03) in CIE 1931 color space, e.g., under a light source in a range (⅓±0.01, ⅓±0.01) in CIE 1931 color space.

The laser mark 36-1 may adjust the area (e.g., an exposed area) of the second upper redistribution layer 30H of the laser mark area 34*r* on the plane (e.g., on the X-Y plane) and the total area of the mesh-type insulating patterns MP on the plane (e.g., on the X-Y plane), thereby adjusting the reflectance difference (e.g., the shade difference) between the second upper redistribution layer 30H and the mesh-type redistribution insulating patterns MP. For example, the exposed area of the second upper redistribution layer 30H and the mesh-type redistribution insulating pattern MP may have different reflectance from each other.

For example, in the inventive concept, the area of the second upper redistribution layer 30H may be adjusted to 70% to 90% on the plane (e.g., on the X-Y plane) inside the laser mark area 34*r*, and the total area of the mesh-type insulating patterns MP on the plane (e.g., on the X-Y plane) may be adjusted to 10% to 30%. In this case, light incident on the laser mark area 34*r* may be totally reflected from the second upper redistribution layer 30H, and thus the color of the laser mark 36-1 may be visibly implemented as white, and accordingly, the visibility of the laser mark 36-1 may be further improved. The white color may be in a range (⅓±0.03, ⅓±0.03) in CIE 1931 color space, e.g., under a light source in a range (⅓±0.01, ⅓±0.01) in CIE 1931 color space.

Figure 5:
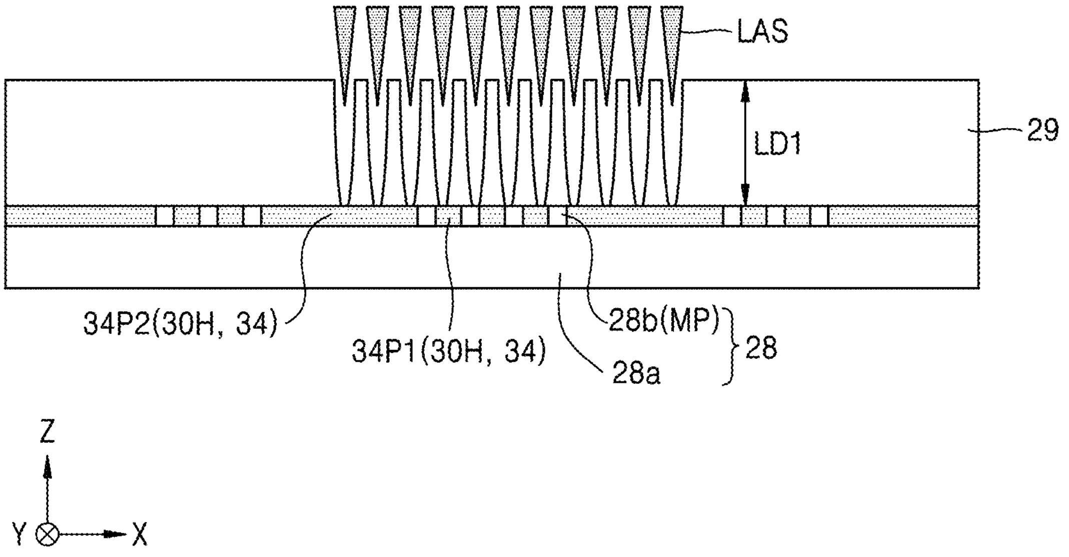
FIGS. 5 and 6 are cross-sectional views illustrating an embodiment of a manufacturing process of forming a laser mark along a cross-section SE1-SE1' of FIG. 4.
Figure 6:
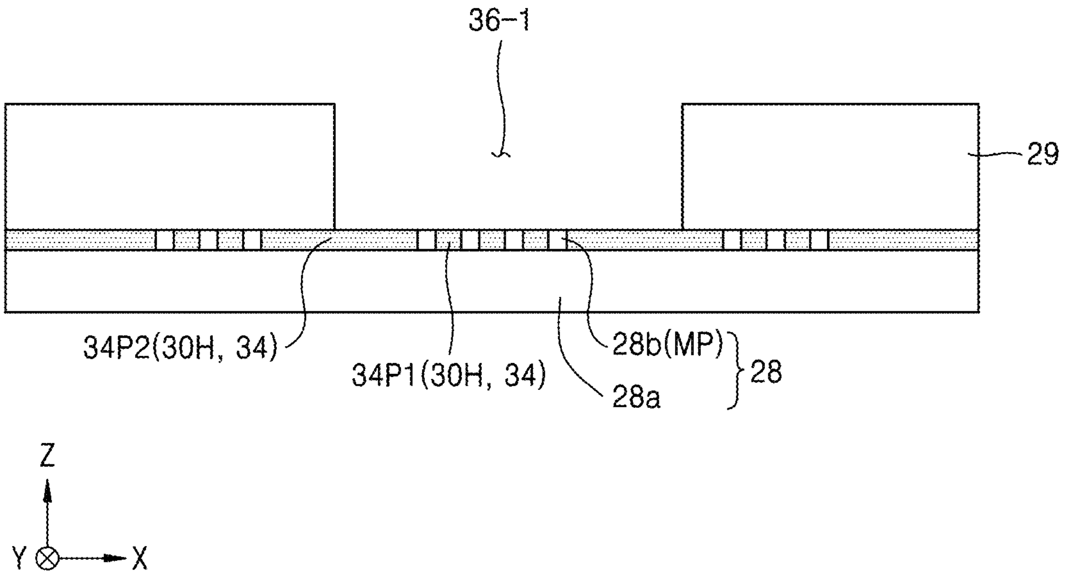

FIGS. 5 and 6 are cross-sectional views illustrating an embodiment of a manufacturing process of forming the laser mark 36-1 according to SE1-SE1' of FIG. 4.

For example, in FIGS. 5 and 6, the same reference numerals as or similar reference numerals to those of FIGS. 1 to 4 denote the same or similar members. In descriptions with respect to FIGS. 5 and 6, the descriptions given with reference to FIGS. 1 to 4 will be briefly provided or omitted.

As shown in FIG. 5, the second upper redistribution layer 30H and the second upper redistribution insulating layer 28*b* are formed on the second lower redistribution insulating layer 28*a*. The second lower redistribution insulating layer 28*a* and the second upper redistribution insulating layer 28*b* constitute the second redistribution insulating layer 28.

A plurality of mesh-type redistribution insulating patterns MP spaced apart from each other in the X-direction are formed inside the second upper redistribution layer 30H. The second upper redistribution layer 30H may be the laser mark metal layer 34.

According to the formation of the mesh-type redistribution insulating patterns MP, the second upper redistribution layer 30H may include the first laser mark metal pattern 34P1 and the second laser mark metal pattern 34P2. The second length (or second width) of the second laser mark metal pattern 34P2 may be greater than the first length (or first width) of the first laser mark metal pattern 34P1 in the X direction, e.g., in a cross-sectional view.

The laser mark insulating layer 29 is formed on the second upper redistribution layer 30H and the second upper redistribution insulating layer 28*b*. The laser mark insulating layer 29 is formed on the first laser mark metal pattern 34P1, the second laser mark metal pattern 34P2, and the mesh-type redistribution insulating patterns MP. In some embodiments, the laser mark insulating layer 29 may be a film in which an inorganic filler (e.g., silicon oxide) is dispersed in an epoxy resin.

A laser LAS is applied to the laser mark insulating layer 29. The laser LAS may penetrate the laser mark insulating layer 29 and reach surfaces of the first laser mark metal pattern 34P1 and the second laser mark metal pattern 34P2, and the mesh-type redistribution insulating patterns MP. A penetration depth (e.g., a marking depth, LD1) of the laser LAS may be the same as the thickness of the laser mark insulating layer 29, for example, several to several tens of micrometers (μm).

As shown in FIG. 6, when the laser LAS is applied to the laser mark insulating layer 29, a part of the laser mark insulating layer 29 may be melted and evaporated by ablation generated by the laser LAS so that the laser mark 36-1 may be formed.

The laser mark 36-1 may expose the second upper redistribution layer 30H and the mesh-type redistribution insulating patterns MP. The first laser mark metal pattern 34P1 and the second laser mark metal pattern 34P2 exposed by the laser mark 36-1 may be adjacent to each other on a cross-section.

Figure 7:
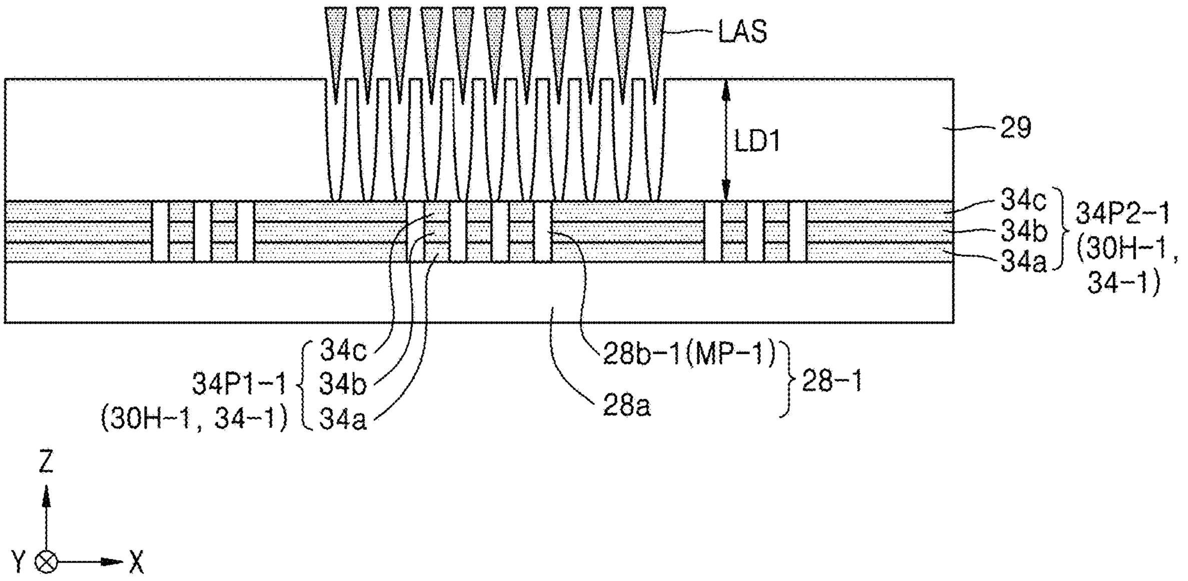
FIGS. 7 and 8 are cross-sectional views illustrating an embodiment of a manufacturing process of forming a laser mark along the cross-section SE1-SE1' of FIG. 4.
Figure 8:
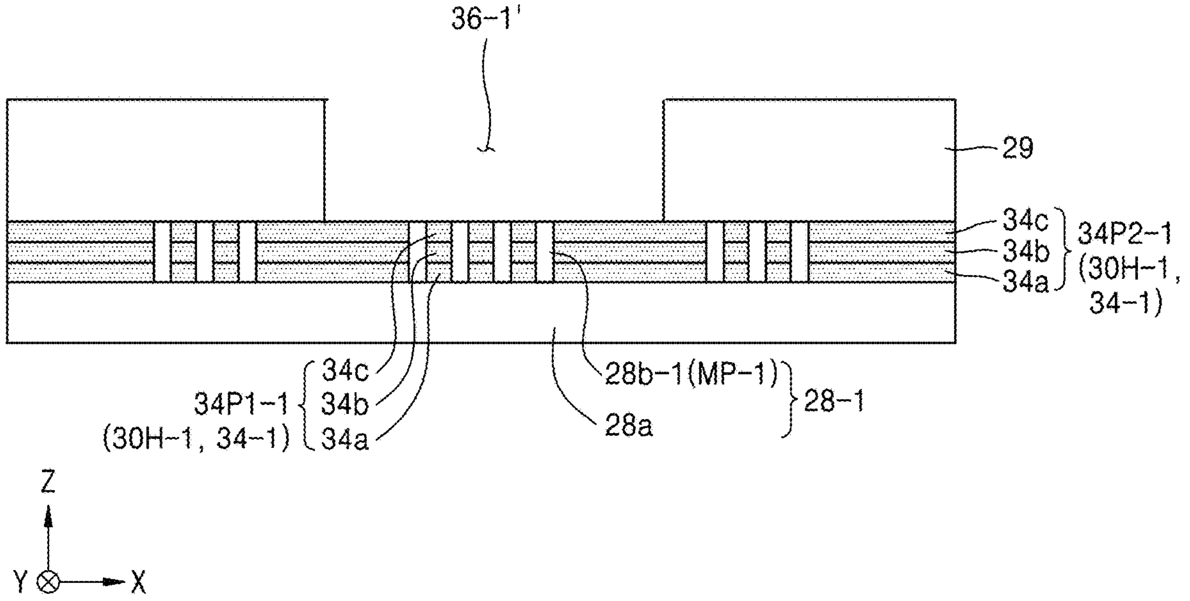

FIGS. 7 and 8 are cross-sectional views illustrating an embodiment of a manufacturing process of forming a laser mark 36-1' according to SE1-SE1' of FIG. 4.

For example, in FIGS. 7 and 8, the same reference numerals as or similar reference numerals to those of FIGS. 5 and 6 denote the same or similar members. In descriptions with respect to FIGS. 7 and 8, the descriptions given with reference to FIGS. 5 and 6 will be briefly provided or omitted.

As shown in FIG. 7, a second upper redistribution layer 30H-1 and a second upper redistribution insulating layer 28*b*-1 are formed on the second lower redistribution insulating layer 28*a*. The second lower redistribution insulating layer 28*a* and the second upper redistribution insulating layer 28*b*-1 constitute a second redistribution insulating layer 28-1. A plurality of mesh-type redistribution insulating patterns MP-1 spaced apart from each other in the X-direction are formed inside the second upper redistribution layer 30H-1.

The second upper redistribution layer 30H-1 may be a laser mark metal layer 34-1. The laser mark metal layer 34-1 may include a plurality of metal layers. The laser mark metal layer 34-1 may include a first metal layer 34*a*, a second metal layer 34*b*, and a third metal layer 34*c*. The second metal layer 34*b* and the third metal layer 34*c* may be material layers for preventing oxidation of the first metal layer 34*a*. For example, when the first metal layer 34*a* is formed as a copper layer, the second metal layer 34*b* and the third metal layer 34*c* may be a nickel layer and a gold layer, respectively.

According to the formation of the mesh-type redistribution insulating patterns MP-1, the second upper redistribution layer 30H-1 may include a first laser mark metal pattern 34P1-1 and a second laser mark metal pattern 34P2-1. A second length (or a second width) of the second laser mark metal pattern 34P2-1 is greater than a first length (or a first width) of the first laser mark metal pattern 34P1-1 in the X direction, e.g., in a cross-sectional view.

The laser mark insulating layer 29 is formed on the second upper redistribution layer 30H-1 and the second upper redistribution insulating layer 28*b*-1. The laser mark insulating layer 29 is formed on the first laser mark metal pattern

34P1-1, the second laser mark metal pattern 34P2-1, and the mesh-type redistribution insulating patterns MP-1.

The laser LAS is applied to the laser mark insulating layer 29. The laser LAS may penetrate the laser mark insulating layer 29-1 and reach surfaces of the first laser mark metal pattern 34P1-1, the second laser mark metal pattern 34P2-1, and the mesh-type redistribution insulating patterns MP-1. The penetration depth (e.g., the marking depth, LD1) of the laser LAS may be the same as the thickness of the laser mark insulating layer 29, for example, several to several tens of micrometers (μm).

As shown in FIG. 8, when the laser LAS is applied to the laser mark insulating layer 29, a part of the laser mark insulating layer 29 may be melted and evaporated by ablation generated by the laser LAS so that the laser mark 36-1' may be formed. The laser mark 36-1' may expose the second upper redistribution layer 30H-1 and the mesh-type redistribution insulating patterns MP-1. The laser mark 36-1' may expose the third metal layer 34*c* and the mesh-type redistribution insulating patterns MP-1.

Figure 9:
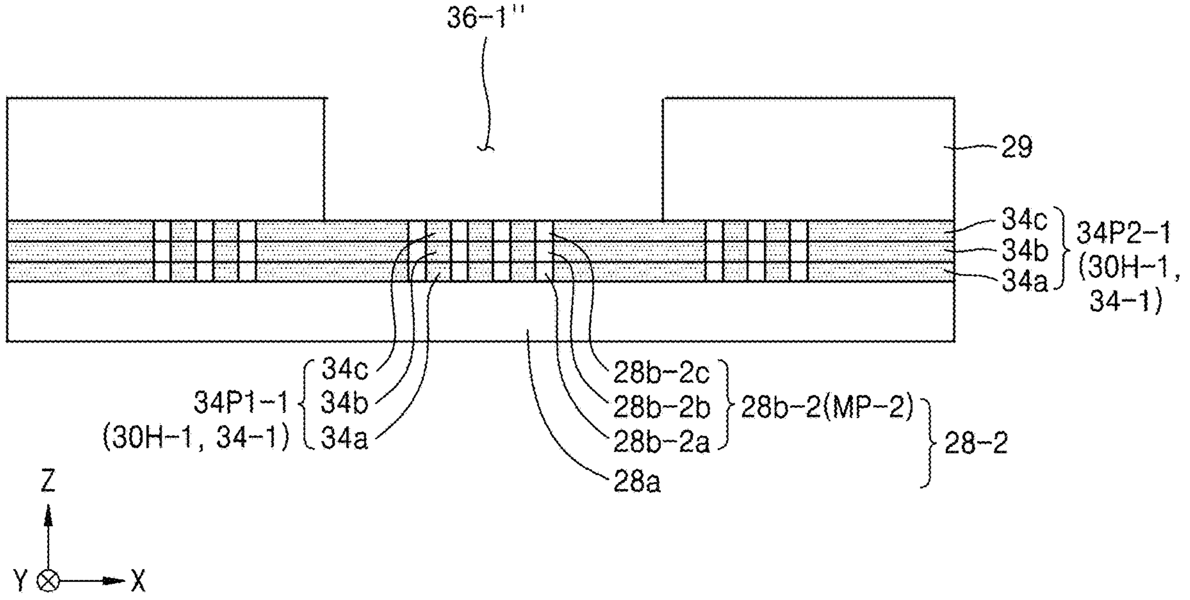
FIG. 9 is a cross-sectional view illustrating an embodiment of a laser mark along the cross-section SE1-SE1' of FIG. 4.

FIG. 9 is a cross-sectional view illustrating an embodiment of a laser mark 36-1" along SE1-SE1' of FIG. 4.

For example, FIG. 9 may be the same as FIG. 8 except that a second upper redistribution insulating layer 28*b*-2 exposed by the laser mark 36-1" includes a plurality of vertically overlapping insulating layers. In FIG. 9, the same reference numerals as or similar reference numerals to those in FIGS. 7 and 8 denote the same or similar members. In descriptions with respect to FIG. 9, the descriptions given with reference to FIGS. 7 and 8 will be briefly provided or omitted.

The second upper redistribution layer 30H-1 and the second upper redistribution insulating layer 28*b*-2 are formed on the second lower redistribution insulating layer 28*a*. The second lower redistribution insulating layer 28*a* and the second upper redistribution insulating layer 28*b*-2 constitute a second redistribution insulating layer 28-2.

The second upper redistribution insulating layer 28*b*-2 may include the plurality of insulating layers. The upper redistribution insulating layer 28*b*-2 may include the plurality of insulating layers to reduce the reflection of light due to destructive interference. The second upper redistribution insulating layer 28*b*-2 may include a first insulating layer 28*b*-2*a*, a second insulating layer 28*b*-2*b*, and a third insulating layer 28*b*-2*c*. For example, side walls of the first, second, and third insulating layers 28*b*-2*a*, 28*b*-2*b*, and 28*b*-2*c* may be vertically aligned to be in the same plane extending in a vertical direction (Z direction).

The first insulating layer 28*b*-2*a*, the second insulating layer 28*b*-2*b*, and the third insulating layer 28*b*-2*c* may be formed of different materials. A plurality of mesh-type redistribution insulating patterns MP-2 spaced apart from each other in the X-direction are formed inside the second upper redistribution layer 30H-1. For example, each of the plurality of mesh-type redistribution insulating patterns MP-2 may be surrounded by and contact the second upper redistribution layer 30H-1.

The second upper redistribution layer 30H-1 may be the laser mark metal layer 34-1. The laser mark metal layer 34-1 may include a plurality of metal layers. The laser mark metal layer 34-1 may include the first metal layer 34*a*, the second metal layer 34*b*, and the third metal layer 34*c*. The second metal layer 34*b* and the third metal layer 34*c* may be material layers for preventing oxidation of the first metal layer 34*a*. For example, when the first metal layer 34*a* is formed as a copper layer, the second metal layer 34*b* and the third metal layer 34*c* may be a nickel layer and a gold layer, respectively.

According to the formation of the mesh-type redistribution insulating patterns MP-2, the second upper redistribution layer 30H-1 may include a first laser mark metal pattern 34P1-1 and a second laser mark metal pattern 34P2-1. A second length (or a second width) of the second laser mark metal pattern 34P2-1 may be greater than a first length (a first width) of the first laser mark metal pattern 34P1-1 in the X direction, e.g., in a cross-sectional view.

The laser mark insulating layer 29 is formed on the second upper redistribution layer 30H-1 and the second upper redistribution insulating layer 28*b*-1. The laser mark insulating layer 29 is formed on the first laser mark metal pattern 34P1-1, the second laser mark metal pattern 34P2-1, and the mesh-type redistribution insulating patterns MP-2.

As shown in FIG. 9, when the laser LAS is applied to the laser mark insulating layer 29, a part of the laser mark insulating layer 29 may be melted and evaporated by ablation generated by the laser LAS so that the laser mark 36-1" may be formed. The laser mark 36-1" may expose the second upper redistribution layer 30H-1 and the mesh-type redistribution insulating patterns MP-2. The laser mark 36-1" may expose the third metal layer 34*c* and the mesh-type redistribution insulating patterns MP-2.

Figure 10A:
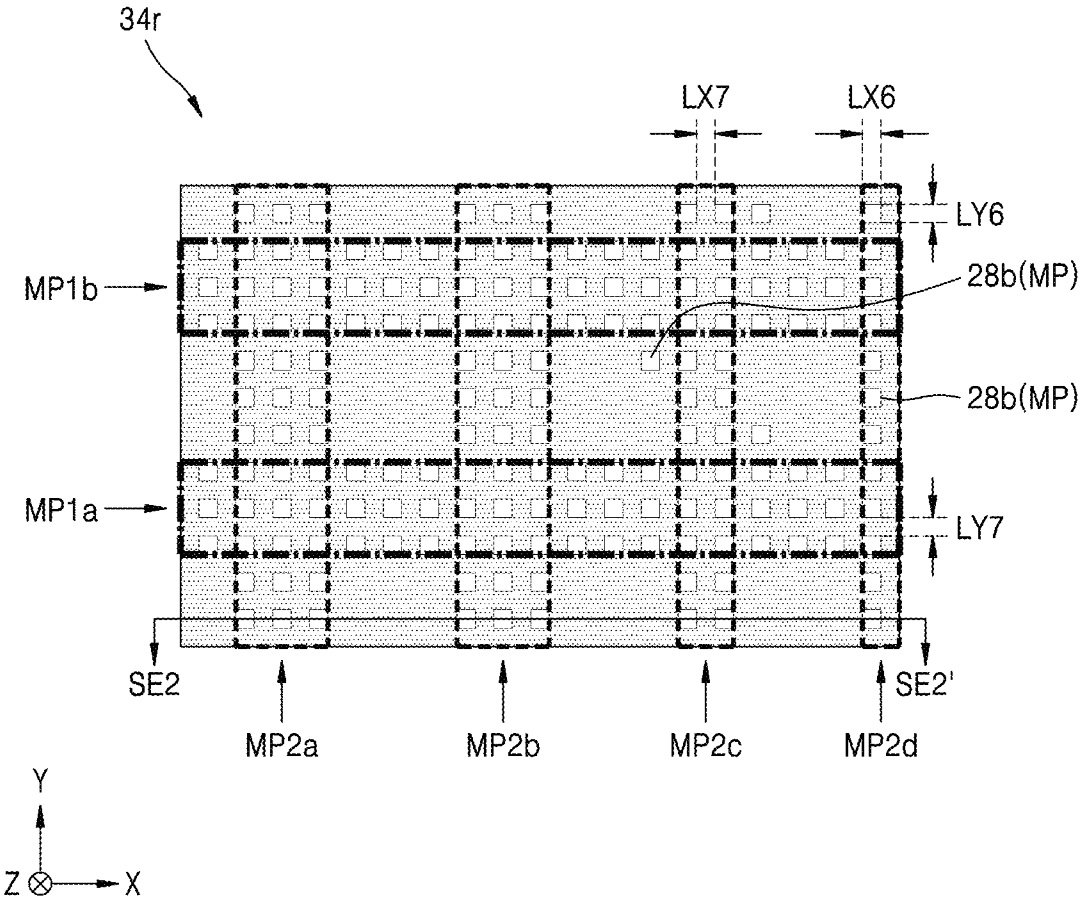
FIGS. 10A and 10B are enlarged plan views illustrating a partial area of a laser mark area of the semiconductor package of FIGS. 1 to 4.
Figure 10B:
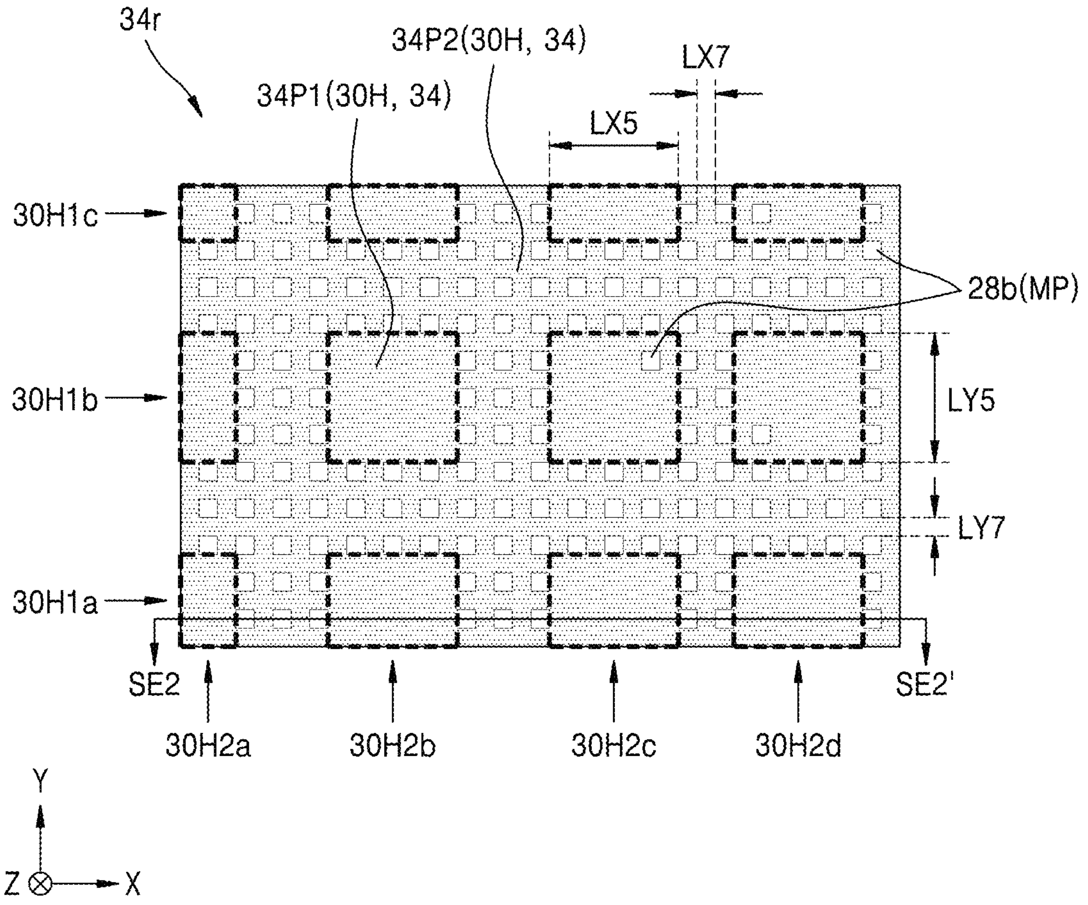

FIGS. 10A and 10B are enlarged plan views illustrating a partial area of the laser mark area 34*r* of the semiconductor package PK1 of FIGS. 1 to 4.

For example, in FIGS. 10A and 10B, the same reference numerals as or similar reference numerals to those of FIGS. 1 to 4 denote the same or similar members. In descriptions with respect to FIGS. 10A and 10B, the descriptions given with reference to FIGS. 1 to 4 will be briefly provided or omitted.

Cross-sections SE2-SE2' of FIGS. 10A and 10B may correspond to FIG. 1 including the second upper redistribution layer 30H and the second upper redistribution insulating layer 28*b* as shown in FIG. 1. For example, plan views of the semiconductor package PK1 of FIG. 1 including the second upper redistribution layer 30H and the second upper redistribution insulating layer 28*b* may correspond to FIGS. 10A and 10B.

The laser mark area 34*r* may include the plurality of mesh-type redistribution insulating patterns MP. The mesh-type redistribution insulating patterns MP may have lengths LX6 and LY6 in the X and Y directions, respectively. The mesh-type redistribution insulating patterns MP may have separation lengths of LX7 and LY7 in the X and Y directions. In some embodiments, LX6, LY6, LX7, and LY7 may be several micrometers (μm) to several tens of micrometers (μm). For example, each of the lengths LX6, LY6, LX7, and LY7 may be between 3 μm and 50 μm.

The plurality of mesh-type redistribution insulating patterns MP may include a plurality of first mesh-type redistribution insulating pattern groups MP1*a* and MP1*b* disposed in an X-direction (a first direction) on a plane and spaced apart from each other in a Y-direction (a second direction) perpendicular to the X-direction (the first direction).

The mesh-type redistribution insulating patterns MP may include a plurality of second mesh-type redistribution insulating pattern groups MP2*a*, MP2*b*, MP2*c*, and MP2*d* arranged in the Y-direction (the second direction) on the plane, and spaced apart from each other in the X-direction (the first direction). The first mesh-type redistribution insulating pattern groups MP1*a* and MP1*b* and the second mesh-type redistribution insulating pattern groups MP2*a*, MP2*b*, MP2*c*, and MP2*d* may be repeatedly arranged in the X-direction (the first direction) and the Y direction (the second direction) in the laser mark area 34*r*.

The laser mark area 34*r* may include the second upper redistribution layer 30H. The second upper redistribution layer 30H may be the laser mark metal layer 34. The second upper redistribution layer 30H may include a plurality of first redistribution pattern groups 30H1*a*, 30H1*b*, and 30H1*c* between the first mesh-type redistribution insulating pattern groups MP1*a* and MP1*b* in the X-direction (the first direction), and spaced apart from each other in the Y-direction (the second direction).

The second upper redistribution layer 30H may include a plurality of second redistribution pattern groups 30H2*a*, 30H2*b*, 30H2*c*, and 30H2*d* between the second mesh-type redistribution insulating pattern groups MP2*a*, MP2*b*, MP2*c*, and MP2*d* in the Y-direction (the second direction) and spaced apart from each other in the X-direction (the first direction). The first redistribution pattern groups 30H1*a*, 30H1*b*, and 30H1*c* and the second redistribution pattern groups 30H2*a*, 30H2*b*, 30H2*c*, and 30H2*d* may be repeatedly disposed in the laser mark area 34*r*.

The first redistribution pattern groups 30H1*a*, 30H1*b*, and 30H1*c* and the second redistribution pattern groups 30H2*a*, 30H2*b*, 30H2*c*, and 30H2*d* may be formed according to the formation of the mesh-type redistribution insulating patterns MP in the second upper redistribution layer 30H. The first redistribution pattern groups 30H1*a*, 30H1*b*, and 30H1*c* and the second redistribution pattern groups 30H2*a*, 30H2*b*, 30H2*c*, and 30H2*d* may have lengths LX5 and LY5 in the X and Y directions, respectively.

The first redistribution pattern groups 30H1*a*, 30H1*b*, and 30H1*c* and the second redistribution pattern groups 30H2*a*, 30H2*b*, 30H2*c*, and 30H2*d* may form the first laser mark metal pattern 34P1. In some embodiments, the one or more mesh-type redistribution insulating patterns MP may be formed inside the first redistribution pattern groups 30H1*a*, 30H1*b*, and 30H1*c* and the second redistribution pattern groups 30H2*a*, 30H2*b*, 30H2*c*, and 30H2*d*.

The first laser mark metal pattern 34P1 may have lengths LX5 and LY5 respectively in the X and Y directions. In some embodiments, LX5 and LY5 may be several micrometers (μm) to several tens of micrometers (μm). For example, each of the lengths LX5 and LY5 may be between 3 μm and 50 μm.

The second laser mark metal pattern 34P2 may be formed between the first redistribution pattern groups 30H1*a*, 30H1*b*, and 30H1*c* and the second redistribution pattern groups 30H2*a*, 30H2*b*, 30H2*c* and 30H2*d* according to the formation of the mesh-type redistribution insulating patterns MP in the second upper redistribution layer 30H. The second laser mark metal pattern 34P2 may have lengths LX7 and LY7 respectively in the X and Y directions.

In some embodiments, LX7 and LY7 may be several micrometers (μm) to several tens of micrometers (μm). For example, each of the lengths LX7 and LY7 may be between 3 μm and 50 μm. The lengths LX7 and LY7 of the second laser mark metal pattern 34P2 in the X and Y directions may be less than the lengths LX5 and LY5 of the first laser mark metal pattern 34P1 in the X and Y directions.

Figure 11:
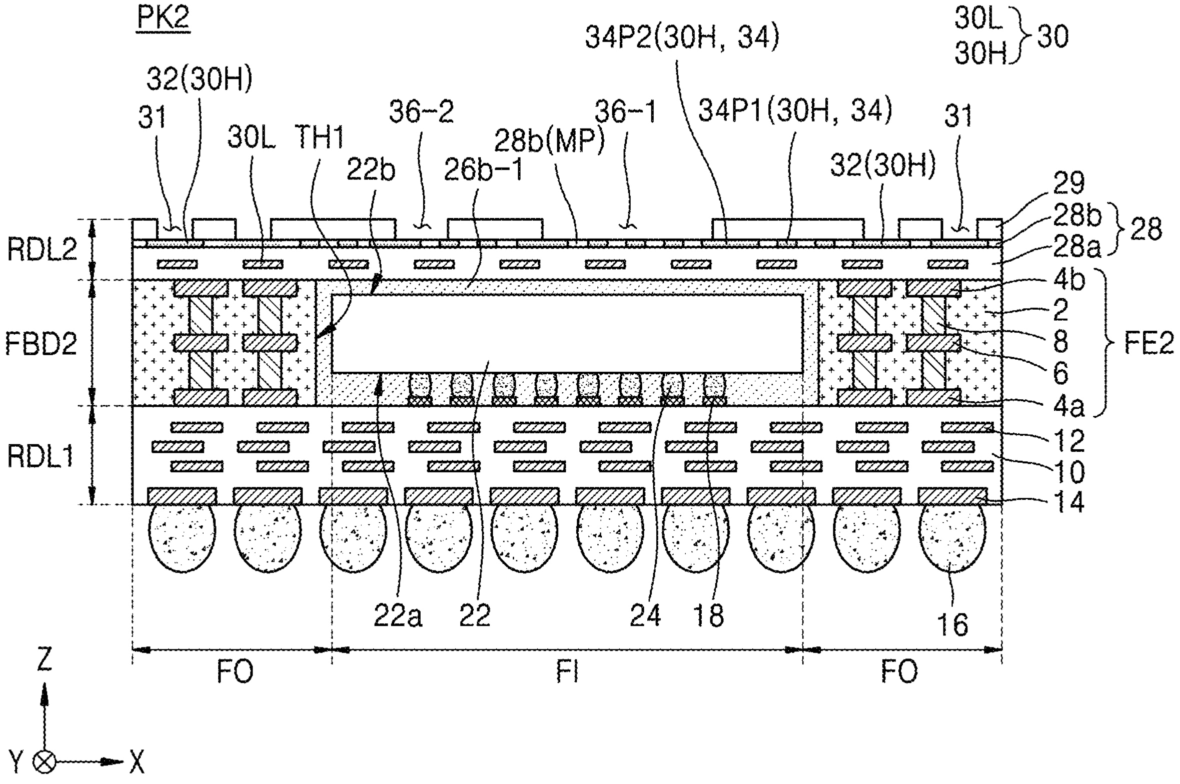
FIG. 11 is a cross-sectional view of a semiconductor package according to an embodiment.

FIG. 11 is a cross-sectional view of a semiconductor package PK2 according to an embodiment.

For example, the semiconductor package PK2 may be the same as the semiconductor package PK1 of FIGS. 1 to 4, except that the semiconductor package PK2 includes a package element FE2. For example, the semiconductor package PK2 may be substantially the same as the semiconductor package PK1 of FIG. 1 except that the package element FE2 includes a wiring substrate 2 and inner wiring layers 4*a*, 4*b*, 6, and 8.

In FIG. 11, the same reference numerals as or similar reference numerals to those of FIGS. 1 to 4 denote the same or similar members. In descriptions with respect to FIG. 11, the descriptions given with reference to FIGS. 1 to 4 will be briefly provided or omitted.

The semiconductor package PK2 may be a fan-out semiconductor package. The semiconductor package PK2 may be a FOPLP-type package. The semiconductor package PK2 includes the fan-in area FI where the semiconductor chip 22 is located, and the fan-out area FO on both sides of the fan-in area FI, e.g., in a cross-sectional view.

The fan-out area FO may surround the fan-in area FI, e.g., in a plan view. FIG. 11 shows one semiconductor chip 22 in the fan-in area FI for convenience. The semiconductor chip 22 may include a front surface 22*a* and a rear surface 22*b*. The front surface 22*a* may be an active surface, and the rear surface 22*b* may be an inactive surface. Chip solder balls 24 are disposed on the front surface 22*a*. The chip solder ball 24 may be a chip connecting ball or a chip connecting bump.

The fan-out area FO may include the package element FE2 having the wiring substrate 2 and the inner wiring layers 4*a*, 4*b*, 6, and 8. The wiring substrate 2 may be an insulating substrate. The wiring substrate 2 may be a printed circuit board. The wiring substrate 2 may be a frame substrate. The wiring substrate 2 may have a through hole TH1 located therein. The semiconductor chip 22 may be located in the through hole TH1.

The inner wiring layers 4*a*, 4*b*, 6, and 8 may include an inner metal layer 6, a metal via layer 8, a lower metal pad layer 4*a*, and an upper metal pad layer 4*b* formed in the wiring substrate 2. The semiconductor chip 22 in the fan-in area FI may be sealed by the fan-in encapsulation layer 26*b*-1. The fan-in encapsulation layer 26*b*-1 may be formed of an EMC.

The semiconductor chip 22 in the fan-in area FI, the fan-in encapsulation layer 26*b* sealing the semiconductor chip 22 in the fan-in area FI, and the package element FE2 having the wiring substrate 2 and the inner wiring layers 4*a*, 4*b*, 6, and 8 in the fan-out area FO may constitute a package body level layer FBD2.

The semiconductor package PK2 may include the first redistribution level layer RDL1 and the second redistribution level layer RDL2. The first redistribution level layer RDL1 is formed on the front surface 22*a* of the semiconductor chip 22, and thus may be referred to as a front redistribution level layer. The second redistribution level layer RDL2 is formed on the rear surface 22*b* of the semiconductor chip 22, and thus may be referred to as a rear redistribution level layer.

The first redistribution level layer RDL1 is disposed on a lower surface of the package body level layer FBD2 and may include a first redistribution layer 12 extending to the fan-out area FO and a first redistribution insulating layer 10 insulating the first redistribution layer 12.

The first redistribution level layer RDL1 may include the first redistribution pad 14 electrically connected to the first redistribution layer 12 and disposed on the lower surface of the first redistribution level layer RDL1. The first solder ball 16 may be disposed on the first redistribution pad 14. The first redistribution level layer RDL1 may include the chip connection pad 18 electrically connected to the first redistribution layer 12 and disposed on the upper surface of the first redistribution level layer RDL1. The chip connection pad 18 may be electrically connected to the chip solder ball 24 of the semiconductor chip 22.

The second redistribution level layer RDL2 may be disposed on the upper surface of the package body level layer FBD2 and include a second redistribution layer 30 extending to the fan-out area FO, and a second redistribution insulating layer 28 insulating the second redistribution layer 30.

The second redistribution layer 30 may include the second lower redistribution layer 30L and the second upper redistribution layer 30H. The second redistribution insulating layer 28 may include the second lower redistribution insulating layer 28*a* and the second upper redistribution insulating layer 28*b*. The laser mark area (34*r* of FIG. 2) may be disposed on the second upper redistribution layer 30H and the second upper redistribution insulating layer 28*b*. The second upper redistribution layer 30H may be the laser mark metal layer 34. The second upper redistribution layer 30H may be a real wiring layer electrically connected to the semiconductor chip 22. For example, the laser mark metal layer 34 may be a wiring layer electrically connected to the semiconductor chip 22 or a dummy metal pattern formed in the same layer as the wiring layer in certain embodiments. For example, the laser mark metal layer 34 may not be electrically connected to the semiconductor chip 22 in certain embodiments.

The second upper redistribution insulating layer 28*b* of the laser mark area (34*r* in FIG. 2) may include the plurality of mesh-type redistribution insulating patterns MP disposed apart from each other on a plane inside the second upper redistribution layer 30H. According to the formation of the mesh-type redistribution insulating patterns MP, the second upper redistribution layer 30H may include the first laser mark metal pattern 34P1 and the second laser mark metal pattern 34P2.

The second redistribution level layer RDL2 may include the laser mark insulating layer 29 having the laser marks 36-1 and 36-2 on the second upper redistribution layer 30H and the second upper redistribution insulating layer 28*b*. The laser mark insulating layer 29 may include the laser marks 36-1 and 36-2 exposing the second upper redistribution layer 30H and the mesh-type redistribution insulating patterns MP in the laser mark area (34*r* of FIG. 2).

The semiconductor package PK2 may include the second redistribution pad 32. The second redistribution pad 32 may be a joint pad electrically coupled to an external semiconductor package. The second redistribution pad 32 may be electrically connected to the second redistribution layer 30.

As described above, in the semiconductor package PK2 of the inventive concept, the laser marks 36-1 and 36-2 may be formed on the second redistribution level layer RDL2, and thus may include a laser mark with good visibility while increasing a degree of freedom in package design without increasing the package thickness.

FIGS. 12 to 15 are cross-sectional views illustrating a method of manufacturing a semiconductor package according to an embodiment.

For example, FIGS. 12 to 15 are views illustrating the method of manufacturing the semiconductor package PK1 of FIGS. 1 to 4. In particular, FIGS. 12 to 15 are cross-sectional views illustrating the semiconductor package PK1 of FIG. 1. In FIGS. 12 to 15, the same reference numerals as or similar reference numerals to those of FIGS. 1 to 4 denote the same or similar members.

Figure 12:
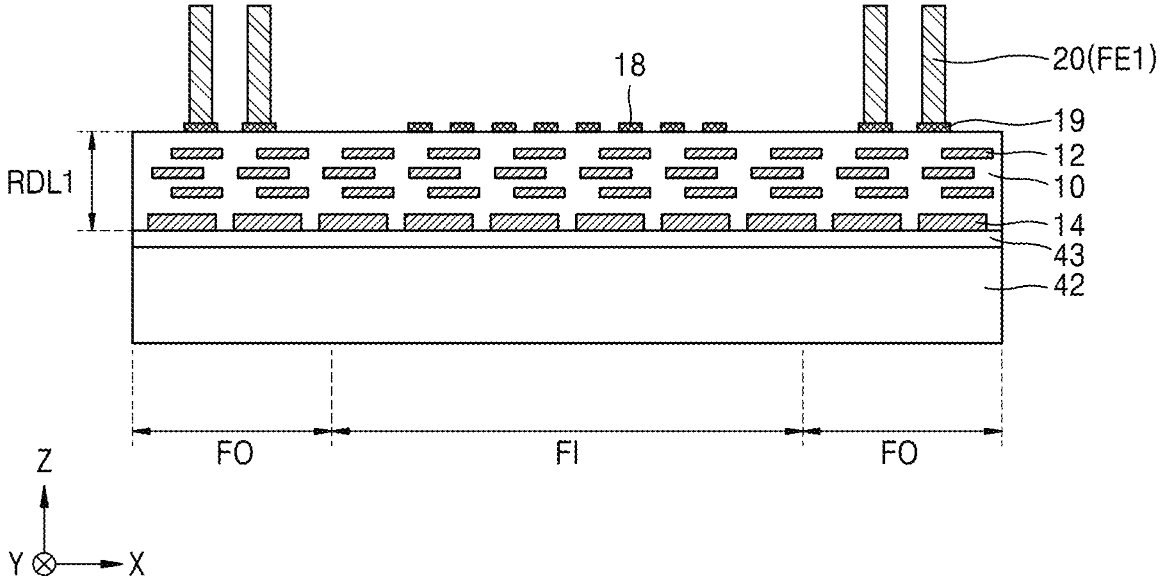
FIGS. 12 to 15 are cross-sectional views illustrating a method of manufacturing a semiconductor package according to an embodiment.

Referring to FIG. 12, the first redistribution level layer RDL1 is formed on a first carrier substrate 42 with an adhesive layer 43 therebetween. The first carrier substrate 42 may be an insulating substrate or a semiconductor substrate. In some embodiments, the first carrier substrate 42 may be a glass substrate (or a glass wafer). In some embodiments, the first carrier substrate 42 may be a silicon substrate (or a silicon wafer).

The first redistribution level layer RDL1 may include the first redistribution layer 12 extending to the fan-out area FO (e.g., from the fan-in area FI) and the first redistribution insulating layer 10 insulating the first redistribution layer 12. The first redistribution level layer RDL1 may include the first redistribution pad 14 electrically connected to the first redistribution layer 12 on the lower surface of the first redistribution level layer RDL1. The first redistribution level layer RDL1 forms the chip connection pad 18 electrically connected to the first redistribution layer 12 on the upper surface of the first redistribution level layer RDL1.

The post connection pad 19 is formed on the upper surface of the first redistribution level layer RDL1 in the fan-out area FO. The chip connection pad (18 in FIG. 9) and the post connection pad 19 are formed by the same process.

Subsequently, the inner wiring layer 20 is formed on the post connection pad 19. In some embodiments, the inner wiring layer 20 of the fan-out area FO may be formed by forming a metal material layer on the post connection pad 19 on the upper surface of the first redistribution level layer RDL1 and then selectively patterning the metal material layer by a photolithography process. In some embodiments, the post connection pad 19 and the inner wiring layer 20 may be formed at once on the first redistribution level layer RDL1 by using a damascene process.

The inner wiring layer 20 may be a metal post layer, for example, a copper post layer. The inner wiring layer 20 may be a metal via layer. The inner wiring layer 20 may be the package element FE1 of the fan-out area FO.

Figure 13:
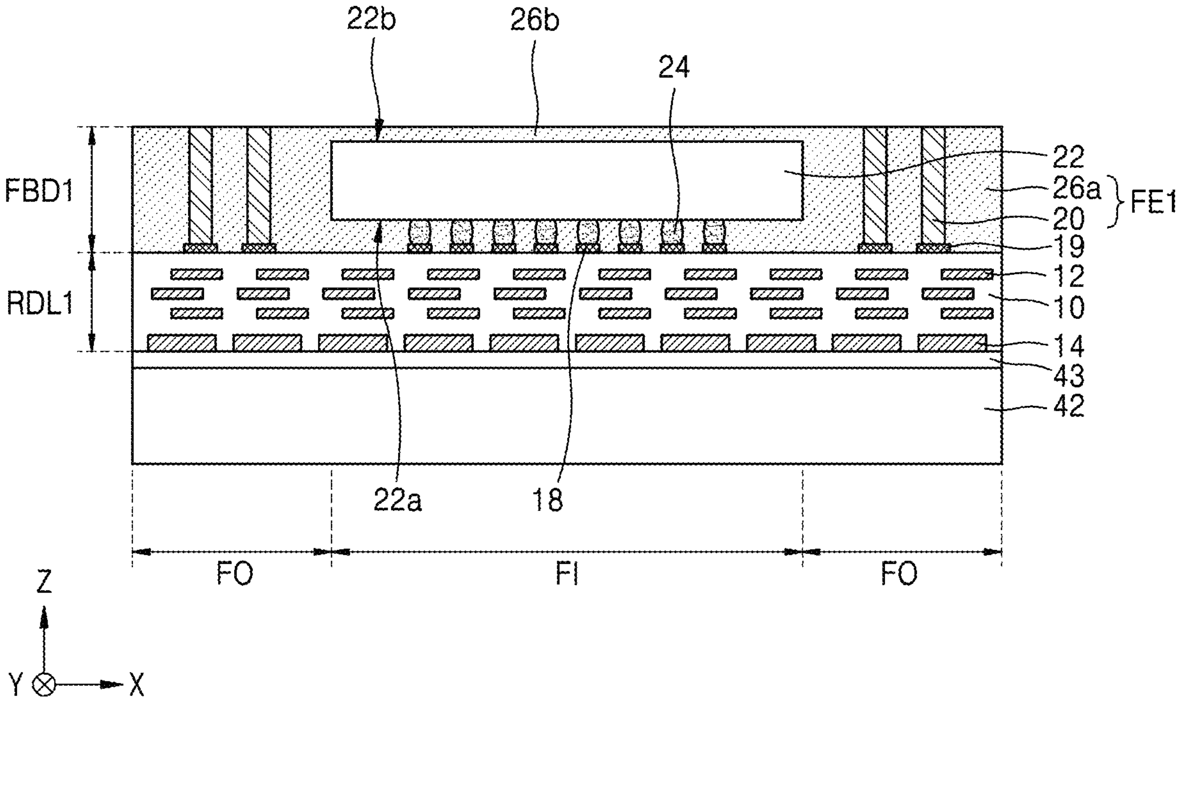

Referring to FIG. 13, the semiconductor chip 22 is mounted in the fan-in area FI. The chip solder ball 24 of the semiconductor chip 22 is electrically connected to the chip connection pad 18 of the first redistribution level layer RDL1.

Subsequently, the encapsulation layers 26*a* and 26*b* respectively sealing the semiconductor chip 22 and the inner wiring layer 20 to a sufficient thickness are formed on the first redistribution level layer RDL1. The encapsulation layers 26*a* and 26*b* may be formed to have a top surface at the same plane as that of the inner wiring layer 20 by using a planarization process.

The encapsulation layers 26*a* and 26*b* may include the fan-in encapsulation layer 26*b* sealing the semiconductor chip 22 in the fan-in area FI and the fan-out encapsulation layer 26*a* sealing the inner wiring layer 20 in the fan-out area FO. The fan-out encapsulation layer 26*a* sealing the inner wiring layer 20 may be the package element FE1 of the fan-out area FO. Accordingly, the semiconductor chip 22 in the fan-in area FI, the fan-in encapsulation layer 26*b* sealing the semiconductor chip 22 in the fan-in area FI, and the package element FE1 having the inner wiring layer 20 in the fan-out area FO and the fan-out encapsulation layer 26*a* form the package body level layer FBD1.

Figure 14:
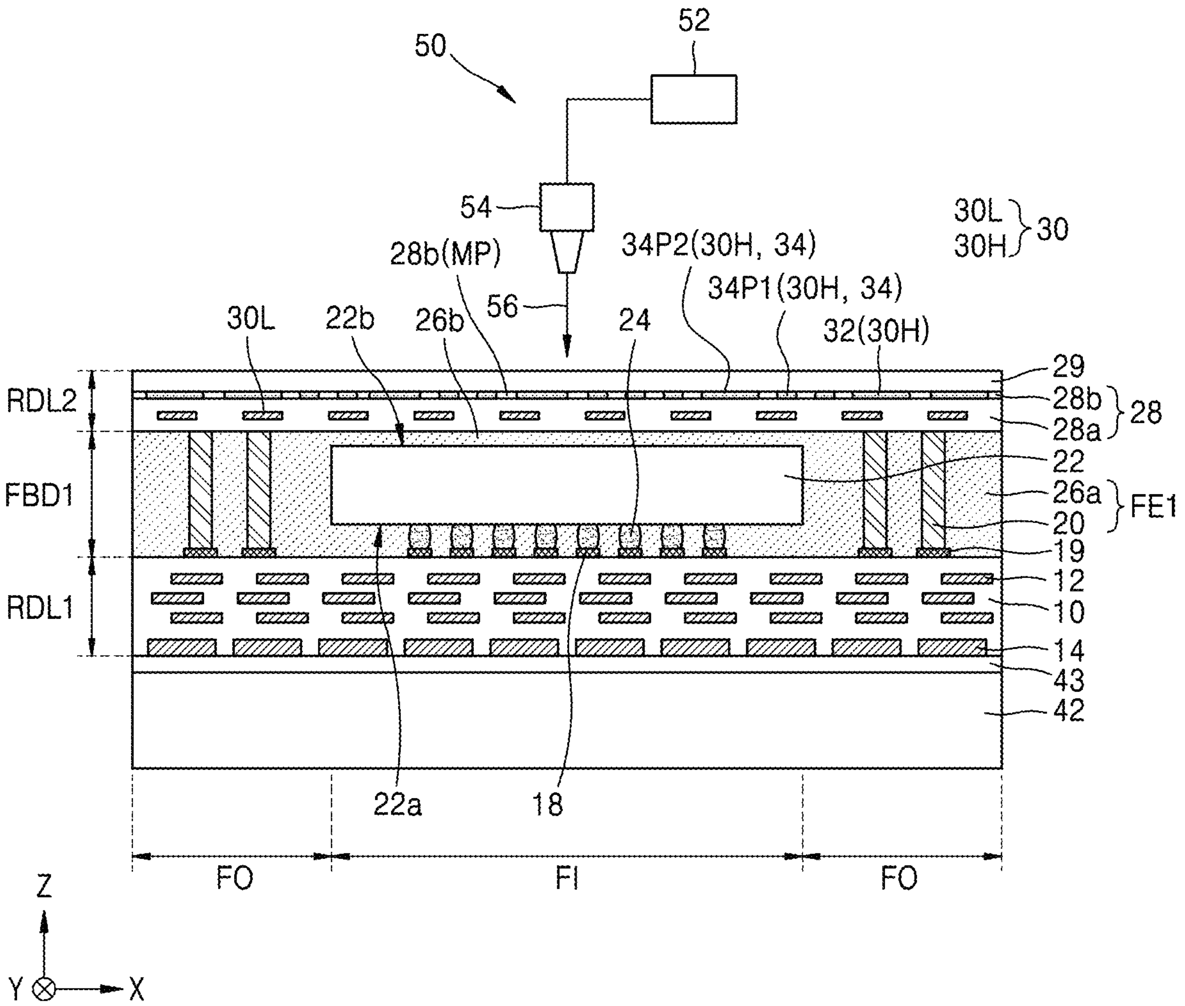
Figure 15:
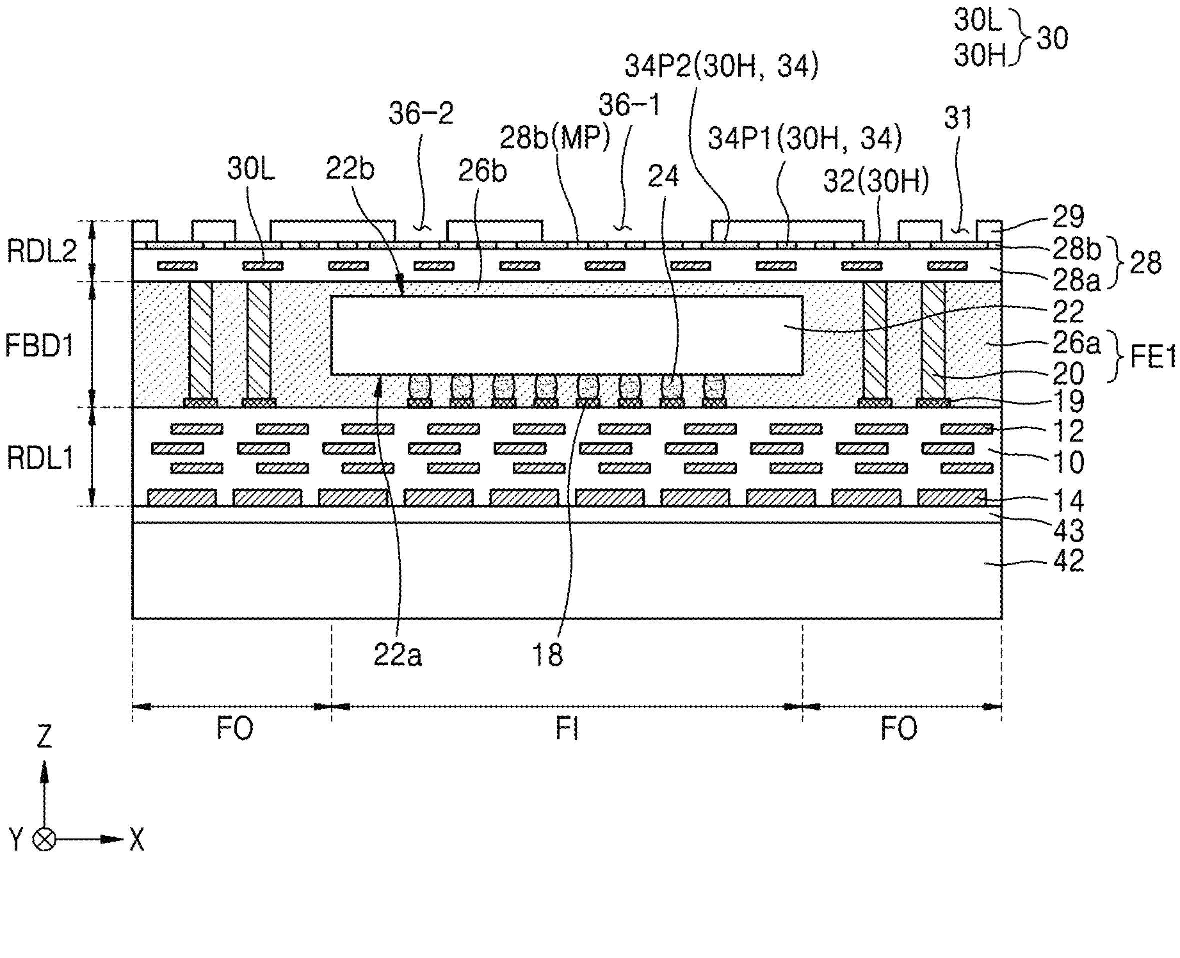

Referring to FIGS. 14 and 15, as shown in FIG. 14, the second redistribution level layer RDL2 is formed on the encapsulation layers 26*a* and 26*b* and the inner wiring layer 20. The second redistribution level layer RDL2 may be disposed on the upper surface of the package body level layer FBD1 and include the second redistribution layer 30 extending to the fan-out area FO (e.g., from the fan-in area FI), the second redistribution insulating layer 28 insulating the second redistribution layer 30, and the laser mark insulating layer 29 formed on the second redistribution layer 30 and the second redistribution insulating layer 28.

The second redistribution layer 30 may include the second lower redistribution layer 30L and the second upper redistribution layer 30H. The second redistribution insulating layer 28 may include the second lower redistribution insulating layer 28*a* and the second upper redistribution insulating layer 28*b*. The second upper redistribution insulating layer 28*b* may include the plurality of mesh-type redistribution insulating patterns MP disposed apart from each other on a plane inside the second upper redistribution layer 30H.

Spatially relative terms, such as "beneath," "below," "lower," "above," "upper," "lateral," "vertical" and the like, may be used herein for ease of description to describe positional relationships. It will be understood that the spatially relative terms encompass different orientations of the device in addition to the orientation depicted in the figures.

The second upper redistribution layer 30H may be the laser mark metal layer 34. The second upper redistribution layer 30H may include the first laser mark metal pattern 34P1 and the second laser mark metal pattern 34P2. The second upper redistribution layer 30H may include the second redistribution pad 32.

Subsequently, as shown in FIGS. 14 and 15, the laser marks 36-1 and 36-2 are formed in the laser mark insulating layer 29 by using a laser mark forming apparatus 50. The laser mark forming apparatus 50 includes a controller 52 and a laser source unit 54. The laser source unit 54 is controlled by the controller 52 to generate a laser 56. The controller 52 may adjust the wavelength or energy of the laser 56.

In some embodiments, the laser 56 may be a visible light laser having a wavelength between 400 nm and 700 nm. The laser 56 may be a green laser having a wavelength of 495 nm to 570 nm. The laser 56 may be a green laser having a wavelength of 532 nm. In some embodiments, the laser 56 may be an ultraviolet laser having a wavelength between 100 nm and 400 nm, such as 355 nm. In some embodiments, the laser 36 may have an energy of several Watts.

The laser 56 generated from the laser source unit 54 is applied to the laser mark insulating layer 29 while controlling a wavelength and/or energy to form the laser marks 36-1 and 36-2. The laser mark forming apparatus 50 may move in the X and Y directions to apply the laser 56 to the laser mark insulating layer 29 and form the laser marks 36-1 and 36-2 inside the laser mark area (34*r* in FIG. 3). Next, the laser mark insulating layer 29 is patterned to form the contact hole 31 exposing the second redistribution pad 32.

Subsequently, the first carrier substrate 42 and the adhesive layer 43 are removed. As shown in FIG. 1, the semiconductor package PK1 may be manufactured by forming the first solder ball 16 on the first redistribution pad 14 on the lower surface of the first redistribution level layer RDL.

Figure 16:
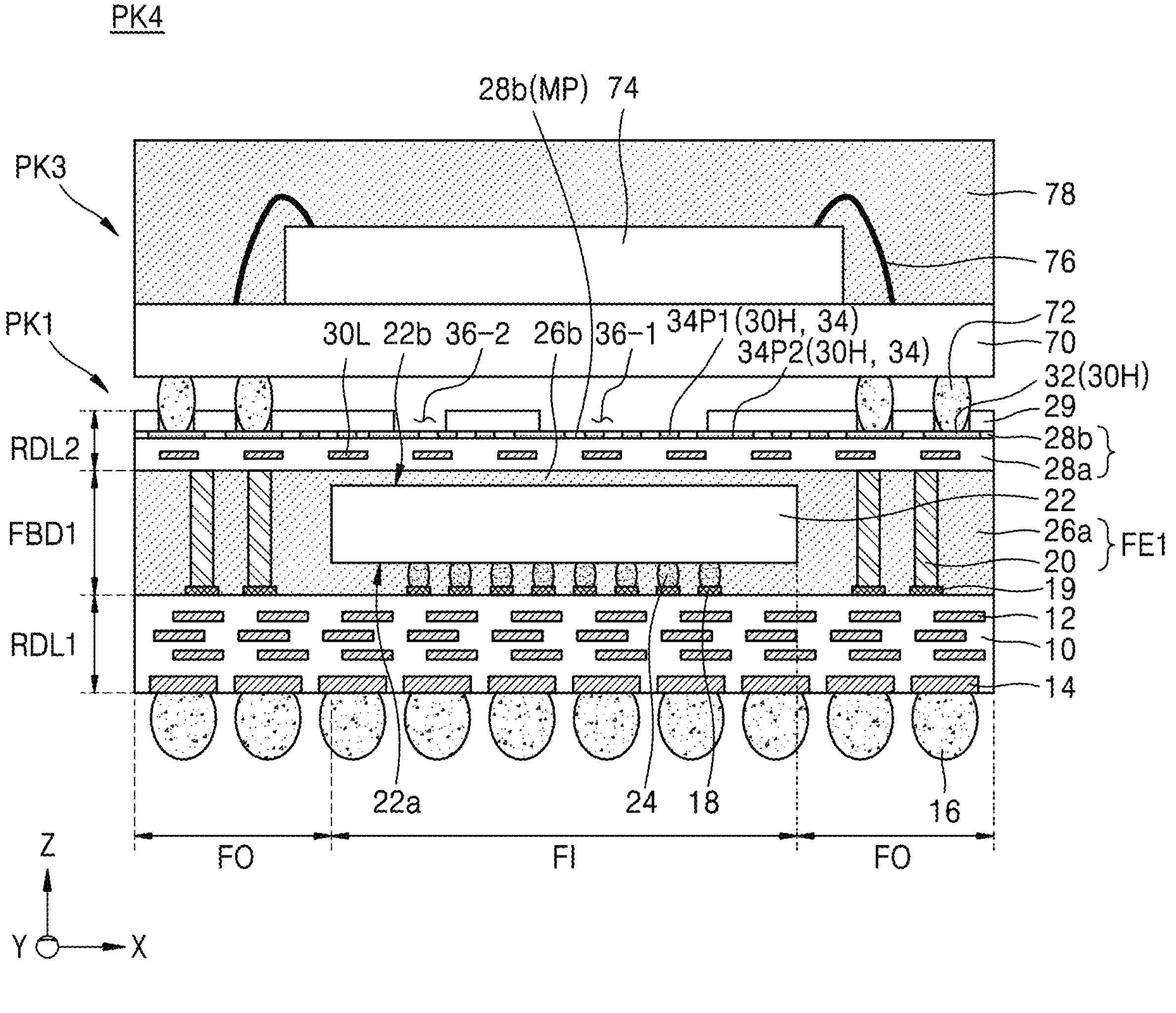
FIG. 16 is a cross-sectional view of a semiconductor package according to an embodiment.

FIG. 16 is a cross-sectional view of a semiconductor package PK4 according to an embodiment.

For example, the semiconductor package PK4 of FIG. 16 may be the same as the semiconductor package PK1 of FIGS. 1 to 4, except that a second semiconductor package PK3 is further stacked on the semiconductor package PK1. In FIG. 16, the same reference numerals as or similar reference numerals to those of FIGS. 1 to 4 denote the same or similar members.

The semiconductor package PK4 includes the semiconductor package PK1 and the second semiconductor package PK3 stacked on the semiconductor package PK1. The semiconductor package PK4 may be a package-on-package (POP)-type package in which packages are stacked on a package. The semiconductor package PK1 has been described above, and thus a description thereof will be briefly provided or omitted.

In the semiconductor package PK1, the second redistribution pad 32 and the laser marks 36-1 and 36-2 are formed on the second redistribution level layer RDL2. The laser marks 36-1 and 36-2 may have information about the semiconductor package PK1. When manufacturing the POP-type package, a semiconductor package having specific information may be selected from among various packages.

The second semiconductor package PK3 is stacked on the second redistribution pad 32 of the semiconductor package PK1. The second semiconductor package PK3 may include a second solder ball 72 formed on a lower portion (e.g., disposed on a bottom surface) of a second wiring substrate 70, a second semiconductor chip 74 formed on an upper portion (e.g., disposed on a top surface) of the second wiring substrate 70, a bonding wire 76 electrically connecting the second semiconductor chip 74 to the second wiring substrate 70, and a second encapsulation layer 78 sealing the second semiconductor chip 74 on the second wiring substrate 70. For example, the second encapsulation layer 78 may encapsulate the second semiconductor chip 74 and may contact side surfaces and a top surface of the second semiconductor chip 74.

The second wiring substrate 70 may be a printed circuit board. The second semiconductor chip 74 may be the same chip as the semiconductor chip 22 described above. For example, the second semiconductor chip 74 may be a logic chip, a PMIC chip, or a memory chip. The second solder ball 72 of the second semiconductor package PK3 may be electrically connected to (e.g., contact) the second redistribution pad 32.

Figure 17:
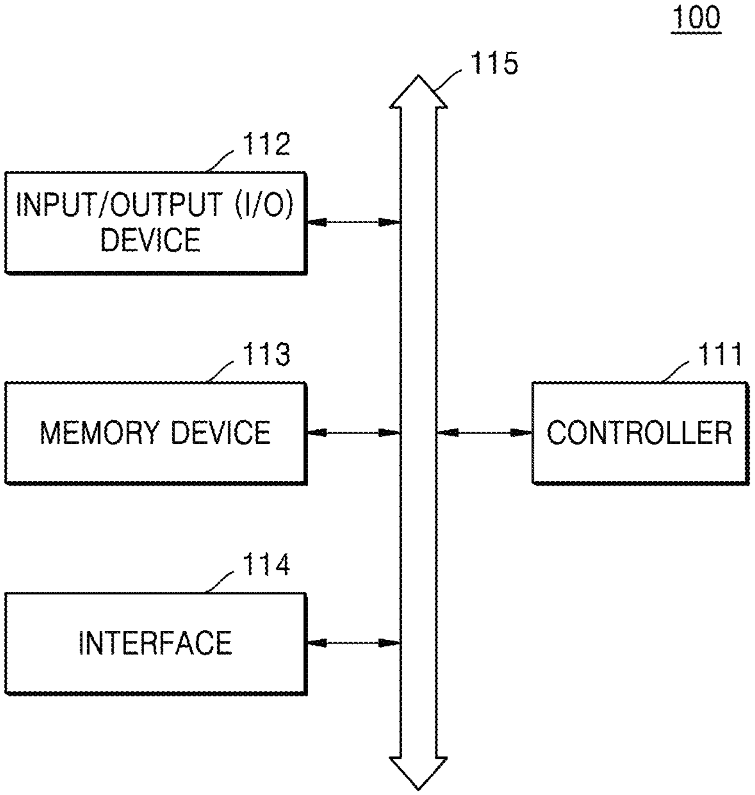
FIG. 17 is a schematic block diagram illustrating an example of a memory system having a semiconductor package according to an embodiment.

FIG. 17 is a schematic block diagram illustrating an example of a memory system 100 having a semiconductor package according to an embodiment.

For example, the memory system 100 may be applied to or may be a personal digital assistant (PDA), a portable computer, a web tablet, a wireless phone, a mobile phone, a digital music player, a memory card, or any device capable of transmitting and/or receiving information in a wireless environment.

The memory system 100 may include a controller 111, an input/output (I/O) device 112, such as a keypad, a keyboard, and a display device, a memory device 113 (or a memory chip), an interface 114, and a bus 115. The memory device 113 and the interface 114 communicate with each other via the bus 115.

The controller 111 may include or may be a microprocessor, a digital signal processor, a microcontroller, or another processing device similar thereto. The memory device 113 may be used to store a command executed by the controller 111. The I/O device 112 may receive data or signals from the outside of the memory system 100 or may output data or signals to the outside of the memory system 100. For example, the input/output device 112 may include or may be a keyboard, a keypad, or a display device.

The memory device 113 and the controller 111 may include the semiconductor packages PK1, PK2, and/or PK4 according to the embodiment. The memory device 113 may further include other types of memories, volatile memories that may be accessed at any time, and/or other various types of memories. The interface 114 transmits data to or receives data from a communication network.

Figure 18:
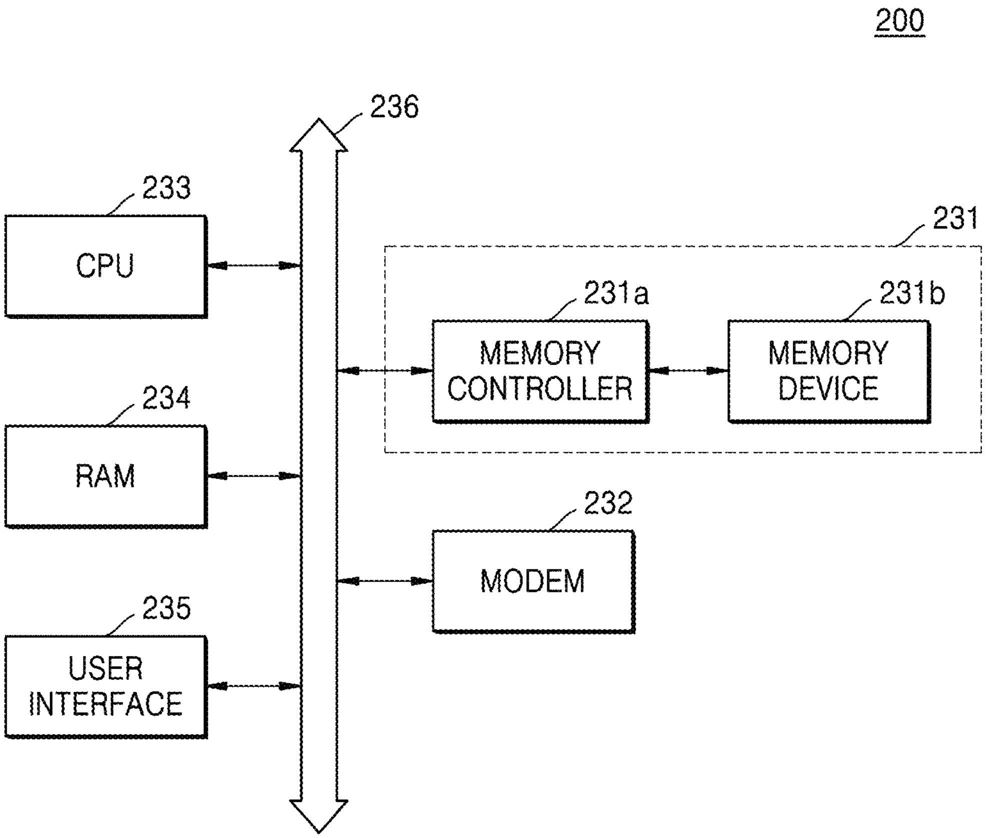
FIG. 18 is a schematic block diagram illustrating an example of an information processing system having a semiconductor package according to an embodiment.

FIG. 18 is a schematic block diagram illustrating an example of an information processing system 200 having a semiconductor package according to an embodiment.

For example, the information processing system 200 may be used in or may be a mobile device or a desktop computer. The information processing system 200 may include a memory system 231 including a memory controller 231*a* and a memory device 231*b*.

The information processing system 200 includes a MOdulator and DEModulator (MODEM) 232 electrically coupled to a system bus 236, a CPU 233, RAM 234, and a user interface 235. Data processed by the CPU 233 or data input from the outside is stored in the memory system 231.

The memory system 231 including the memory controller 231*a* and the memory device 231*b*, the MODEM 232, the CPU 233, and the RAM 234 may include the semiconductor package PK1, PK2, and PK4 according to the embodiment.

The memory system 231 may be a solid state drive, and in this case, the information processing system 200 may stably store a large amount of data in the memory system 231. As reliability increases, the memory system 231 may reduce resources required for error correction, thereby providing a high-speed data exchange function to the information processing system 130.

Even though different figures show variations of exemplary embodiments and different embodiments disclose different features from each other, these figures and embodiments are not necessarily intended to be mutually exclusive from each other. Rather, as recognized from the context of the detailed description above, certain features depicted in different figures and/or described above in different embodiments can be combined with other features from other figures/embodiments to result in additional various embodiments, when taking the figures and related descriptions of embodiments as a whole into consideration. For example, components and/or features of different embodiments described above can be interchangeably combined with components and/or features of other embodiments unless the context indicates otherwise.

Although not shown, it is obvious to those of ordinary skill in the art that an application chipset, a camera image signal processor (ISP), an input/output device, etc. may be further provided to the information processing system 200.

While the inventive concept has been particularly shown and described with reference to embodiments thereof, it will be understood that various changes in form and details may be made therein without departing from the spirit and scope of the following claims.

What is claimed is:

1. A semiconductor package comprising:

an encapsulation layer encapsulating at least a first semiconductor chip;

a redistribution level layer disposed on the encapsulation layer, the redistribution level layer comprising a redistribution conductive layer and a redistribution insulating layer insulating the redistribution conductive layer;

a laser mark insulating layer located on the redistribution conductive layer and the redistribution insulating layer; and a laser mark area comprising those portions of the redistribution conductive layer, the redistribution insulating layer, and the laser mark insulating layer that are formed within a first region of the semiconductor package with respect to a top down view, the redistribution insulating layer of the laser mark area comprising a plurality of mesh-type redistribution insulating patterns that are spaced apart from each other in a first horizontal direction and surrounded by the redistribution conductive layer, and the laser mark insulating layer of the laser mark area comprising a laser mark directly exposing the redistribution conductive layer and at least some of the mesh-type redistribution insulating patterns, wherein side surfaces of the mesh-type redistribution insulating patterns directly contact the redistribution conductive layer.

2. The semiconductor package of claim 1, wherein the mesh-type redistribution insulating patterns are non-uniformly disposed throughout the redistribution conductive layer of the laser mark area.

3. The semiconductor package of claim 1, wherein, with respect to a horizontal cross section, the redistribution conductive layer occupies 70% to 90% of the first region, and the mesh-type redistribution insulating patterns occupies 10% to 30% of the first region.

4. The semiconductor package of claim 1, wherein a combination of the laser mark and the redistribution level layer directly exposed by the laser mark visibly exhibits a white color.

5. The semiconductor package of claim 1, wherein the redistribution conductive layer is a wiring layer electrically connected to the first semiconductor chip.

6. The semiconductor package of claim 1, wherein:

with respect to a top down view, the mesh-type redistribution insulating patterns of the laser mark area are arranged in a plurality of rows extending in the first horizontal direction and a plurality of columns extending in a second horizontal direction, the plurality of rows of mesh-type redistribution insulating patterns are arranged in first groups, wherein spacing in the second horizontal direction of adjacent first groups is greater than spacing in the second horizontal direction between adjacent rows comprising the first groups of rows, and the plurality of columns of mesh-type redistribution insulating patterns are arranged in second groups, wherein spacing in the first horizontal direction of adjacent second groups is greater than spacing in the first horizontal direction between adjacent columns comprising the second groups of columns.

7. The semiconductor package of claim 6, wherein the redistribution conductive layer of the laser mark area comprises:

a plurality of first redistribution conductive pattern groups between the first groups of the mesh-type redistribution insulating patterns, the plurality of first redistribution conductive pattern groups arranged in the first horizontal direction and spaced apart from each other in the second horizontal direction; and a plurality of second redistribution conductive pattern groups between the second groups of the mesh-type redistribution insulating patterns, the plurality of second redistribution conductive pattern groups arranged in the second horizontal direction and spaced apart from each other in the first horizontal direction.

8. The semiconductor package of claim 1, wherein the redistribution conductive layer of the laser mark area comprises a plurality of metal layers.

9. The semiconductor package of claim 1, wherein the redistribution insulating layer of the laser mark area comprises a plurality of component insulating layers stacked in a vertical direction.

10. The semiconductor package of claim 1, wherein the redistribution conductive layer directly exposed by the laser mark and the mesh-type redistribution insulating patterns directly exposed by the laser mark are at the same level.

11. A semiconductor package comprising:

an encapsulation layer encapsulating at least one semiconductor chip; and a redistribution level layer disposed on the encapsulation layer, the redistribution level layer comprising a redistribution conductive layer and a redistribution insulating layer insulating the redistribution conductive layer;

a laser mark insulating layer located on the redistribution conductive layer and the redistribution insulating layer; and a laser mark area comprising those portions of the redistribution conductive layer, the redistribution insulating layer, and the laser mark insulating layer that are formed within a first region of the semiconductor package with respect to a top down view, the redistribution conductive layer comprising a laser mark metal layer, the redistribution insulating layer of the laser mark area comprising a plurality of mesh-type redistribution insulating patterns spaced apart from each other in a horizontal direction and surrounded by the laser mark metal layer, and the laser mark insulating layer of the laser mark area comprising a laser mark directly exposing the laser mark metal layer and at least some of the mesh-type redistribution insulating patterns, wherein the laser mark metal layer directly exposed by the laser mark comprises a first laser mark metal pattern having a first length in the horizontal direction and a second laser mark metal pattern having a second length in the horizontal direction greater than the first length, and wherein side surfaces of the redistribution conductive layer directly exposed by the laser mark directly contact side surfaces of the mesh-type redistribution insulating patterns directly exposed by the laser mark.

12. The semiconductor package of claim 11, wherein the first laser mark metal pattern and the second laser mark metal pattern directly exposed by the laser mark are adjacent to each other and the redistribution conductive layer directly exposed by the laser mark and the mesh-type redistribution insulating patterns directly exposed by the laser mark are at the same level.

13. The semiconductor package of claim 11, wherein the laser mark comprises a letter, and a combination of the letter and the redistribution level layer directly exposed by the letter of the laser mark visibly exhibits a white color.

14. The semiconductor package of claim 11, wherein the redistribution conductive layer occupies 70% to 90% of the laser mark area, and the mesh-type redistribution insulating patterns occupy 10% to 30% of the laser mark area.

15. The semiconductor package of claim 11, wherein the redistribution insulating layer of the laser mark area comprises a plurality of component insulating layers, and the redistribution conductive layer located of the laser mark area comprises a plurality of metal layers.

16. A semiconductor package comprising:

a fan-in area in which a semiconductor chip is located; and a fan-out area comprising a package element surrounding the fan-in area and having an inner wiring layer; a package body level layer comprising a fan-in encapsulation layer sealing the semiconductor chip in the fan-in area;

a first redistribution level layer disposed on a lower surface of the package body level layer and comprising a first redistribution conductive layer extending to the fan-out area and a first redistribution insulating layer insulating the first redistribution conductive layer;

a second redistribution level layer disposed on an upper surface of the package body level layer, and comprising a second redistribution conductive layer extending to the fan-out area, and a second redistribution insulating layer insulating the second redistribution conductive layer;

a laser mark insulating layer located on the second redistribution conductive layer and the second redistribution insulating layer; and a laser mark area comprising those portions of the second redistribution conductive layer, the second redistribution insulating layer, and the laser mark insulating layer that are formed within a first region of the semiconductor package with respect to a top down view, the second redistribution insulating layer of the laser mark area comprises a plurality of mesh-type redistribution insulating patterns spaced apart from each other in a horizontal direction, the laser mark insulating layer comprising a laser mark directly exposing the second redistribution conductive layer and the mesh-type redistribution insulating patterns, wherein side surfaces of the second redistribution conductive layer directly exposed by the laser mark directly contact side surfaces of the mesh-type redistribution insulating patterns directly exposed by the laser mark.

17. The semiconductor package of claim 16, wherein:

the second redistribution conductive layer occupies 70% to 90% of the laser mark area in a plan view and the mesh-type redistribution insulating patterns occupy 10% to 30%, of the laser mark area in the plan view, and a combination of the laser mark and the second redistribution level layer directly exposed by the laser mark visibly exhibits a white color.

18. The semiconductor package of claim 16, wherein the package element comprises a wiring substrate having a through hole therein.

19. The semiconductor package of claim 16, wherein the package element further comprises a fan-out encapsulation layer sealing the inner wiring layer of the fan-out area.

20. The semiconductor package of claim 16, wherein the laser mark area is disposed in the fan-in area.

* * * * *